(12) United States Patent  
El-Gamal et al.

(10) Patent No.: US 9,193,583 B2  
(45) Date of Patent: Nov. 24, 2015

(54) LOW-TEMPERATURE WAFER LEVEL PROCESSING FOR MEMS DEVICES

(71) Applicant: The Royal Institution for the Advancement of Learning / McGill University, Montreal (CA)

(72) Inventors: Mourad El-Gamal, Brossard (CA); Dominique Lemoine, St Leonard (CA); Paul-Vahe Cicek, Montreal (CA); Frederic Nabki, Montreal (CA)

(73) Assignee: The Royal Institution for the Advancement of Learning/McGill University, Montreal (CA)

( * ) Notice: Subject to any disclaimer, the term of this patent is extended or adjusted under 35 U.S.C. 154(b) by 212 days.

(21) Appl. No.: 13/661,264

(22) Filed: Oct. 26, 2012

(65) Prior Publication Data

US 2013/0115730 A1 May 9, 2013

Related U.S. Application Data

(62) Division of application No. 12/922,224, filed as application No. PCT/CA2009/000292 on Mar. 11, 2009, now Pat. No. 8,409,901.

(60) Provisional application No. 61/129,090, filed on Jul. 29, 2008, provisional application No. 61/064,534, filed on Mar. 11, 2008.

(51) Int. Cl.
  *H01L 21/768* (2006.01)
  *B81C 1/00* (2006.01)
  (Continued)

(52) U.S. Cl.
  CPC ............ *B81C 1/00301* (2013.01); *G01L 9/0042* (2013.01); *H01L 21/02697* (2013.01);
  (Continued)

(58) Field of Classification Search
  CPC ..................... B81C 1/00301; H01L 21/02697; H01L 23/481; H01L 21/76898
  USPC .............. 438/51–53, 597, 652; 257/415, 750, 257/E21.575, E21.597
  See application file for complete search history.

(56) References Cited

U.S. PATENT DOCUMENTS 6,110,825 A * 8/2000 Mastromatteo et al. ...... 438/667
6,114,240 A * 9/2000 Akram et al. ................. 438/667
(Continued)

FOREIGN PATENT DOCUMENTS

WO   WO 2004109770 A2 * 12/2004

*Primary Examiner* — Michele Fan
(74) *Attorney, Agent, or Firm* — Rosenberg, Klein & Lee

(57) ABSTRACT

It would be beneficial to integrate MEMS devices with silicon CMOS electronics, package them in controlled environments, e.g. vacuum for MEMS resonators, and provide industry standard electrical interconnections such as solder bumps. However, to do so requires through-wafer via-based electrical interconnections. However, the fragile nature of the MEMS devices, the requirement for vacuum, hermetic sealing, and the stresses placed on metallization membranes are not present in conventional CMOS packaging. Accordingly there is provided a means of reinforcing through-wafer vias for integrated MEMS-CMOS circuits by in-filling the through-wafer electrical vias with low temperature deposited ceramic materials deposited with processes compatible with post-processing of CMOS electronics. Beneficially ceramics such as silicon carbide provide enhanced mechanical strength, enhanced expansion matching, and increased thermal conductivity in comparison to silicon and solder materials. The ceramic reinforcing may be further adapted to include microchannels for the provisioning of liquid cooling through the structures.

20 Claims, 15 Drawing Sheets

401 ■ Silicon Dioxide  403 ▨ Aluminum  405 ▨ Pyrex      407 ▨ Silicon Carbide
402 ▢ Silicon         404 ▨ MEMS      406 ▨ Getter     408 ▨ Solder

(51) Int. Cl.
  *G01L 9/00* (2006.01)
  *H01L 23/48* (2006.01)
  *H03H 3/007* (2006.01)
  *H03H 9/10* (2006.01)
  *H01L 21/02* (2006.01)

(52) U.S. Cl.
  CPC ........ *H01L21/76898* (2013.01); *H01L 23/481* (2013.01); *H03H 3/007* (2013.01); *H03H 9/10* (2013.01); *H01L 2224/0401* (2013.01); *H01L 2224/0557* (2013.01); *H01L 2224/131* (2013.01); *H01L 2224/13009* (2013.01); *H01L 2224/13021* (2013.01); *H01L 2224/13023* (2013.01); *H01L 2924/0002* (2013.01); *H01L 2924/00014* (2013.01); *H01L 2924/12044* (2013.01); *H01L 2924/1461* (2013.01)

(56) References Cited

U.S. PATENT DOCUMENTS

| | | | |
|---|---|---|---|
| 6,242,075 B1 * | 6/2001 | Chao et al. | 428/138 |
| 6,410,424 B1 | 6/2002 | Tsai et al. | |
| 6,551,893 B1 * | 4/2003 | Zheng et al. | 438/387 |
| 6,645,851 B1 * | 11/2003 | Ho et al. | 438/626 |
| 6,660,564 B2 | 12/2003 | Brady | |
| 6,809,412 B1 | 10/2004 | Tourino et al. | |
| 6,841,861 B2 | 1/2005 | Brady | |
| 7,018,893 B1 * | 3/2006 | Kundalgurki | 438/254 |
| 7,253,091 B2 | 8/2007 | Brewer et al. | |
| 8,159,059 B2 | 4/2012 | Maeda | |
| 2002/0114058 A1 | 8/2002 | DeReus et al. | |
| 2003/0054584 A1 | 3/2003 | Hinzel et al. | |
| 2003/0100156 A1 * | 5/2003 | Mori | 438/253 |
| 2003/0119220 A1 | 6/2003 | Mlcak et al. | |
| 2003/0190801 A1 | 10/2003 | Griffin, Jr. et al. | |
| 2004/0023429 A1 * | 2/2004 | Foerstner et al. | 438/50 |
| 2004/0061238 A1 * | 4/2004 | Sekine | 257/774 |
| 2004/0201095 A1 * | 10/2004 | Palmer et al. | 257/700 |
| 2004/0253785 A1 * | 12/2004 | Hsu et al. | 438/243 |
| 2005/0009246 A1 | 1/2005 | Enquist et al. | |
| 2005/0121768 A1 | 6/2005 | Edelstein et al. | |
| 2005/0205997 A1 | 9/2005 | Yamamoto et al. | |
| 2006/0043569 A1 * | 3/2006 | Benson et al. | 257/698 |
| 2006/0060956 A1 * | 3/2006 | Tanikella | 257/686 |
| 2006/0211269 A1 | 9/2006 | Goto et al. | |
| 2007/0020914 A1 * | 1/2007 | Higashi | 438/618 |
| 2008/0009123 A1 | 1/2008 | Kostrzewa et al. | |
| 2008/0157279 A1 * | 7/2008 | Horikawa | 257/534 |
| 2009/0224410 A1 * | 9/2009 | Johnson | 257/774 |
| 2009/0256251 A1 | 10/2009 | Getz et al. | |

* cited by examiner

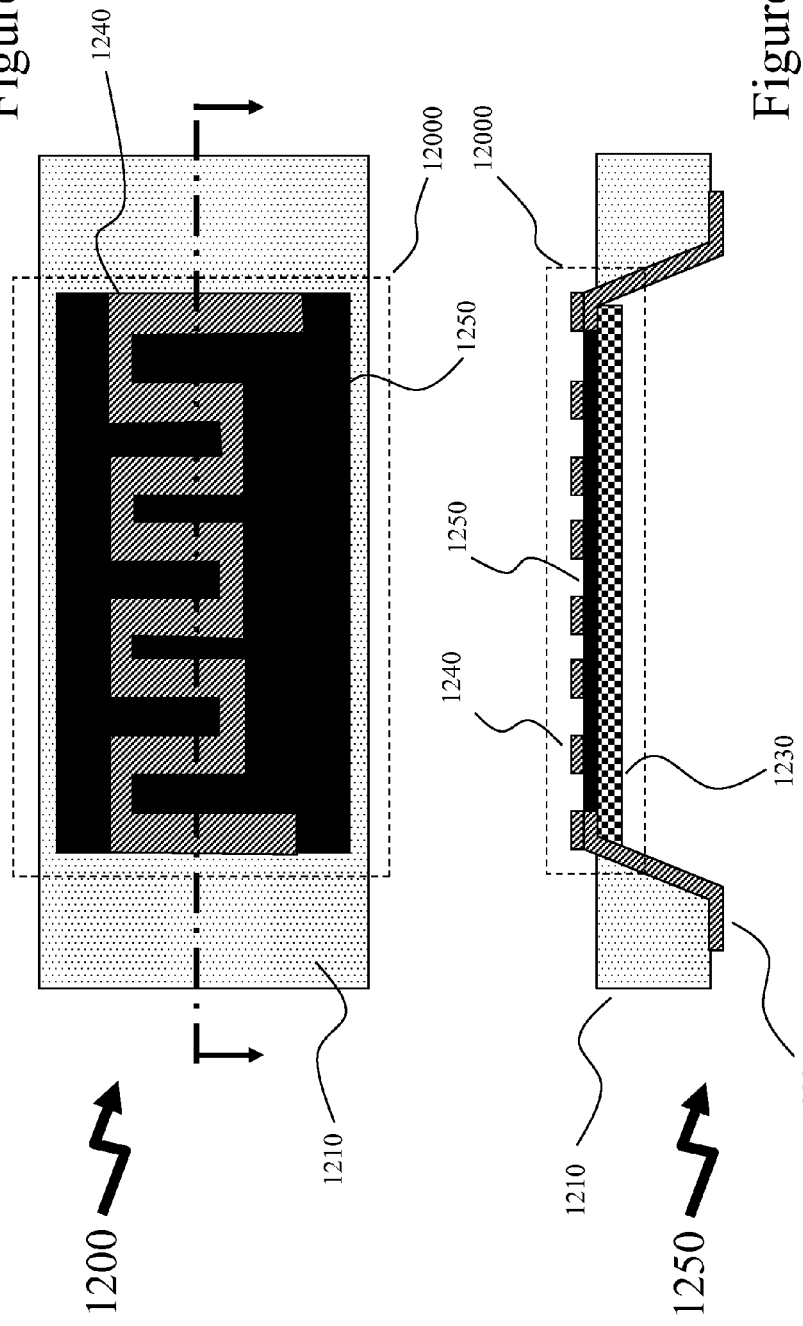

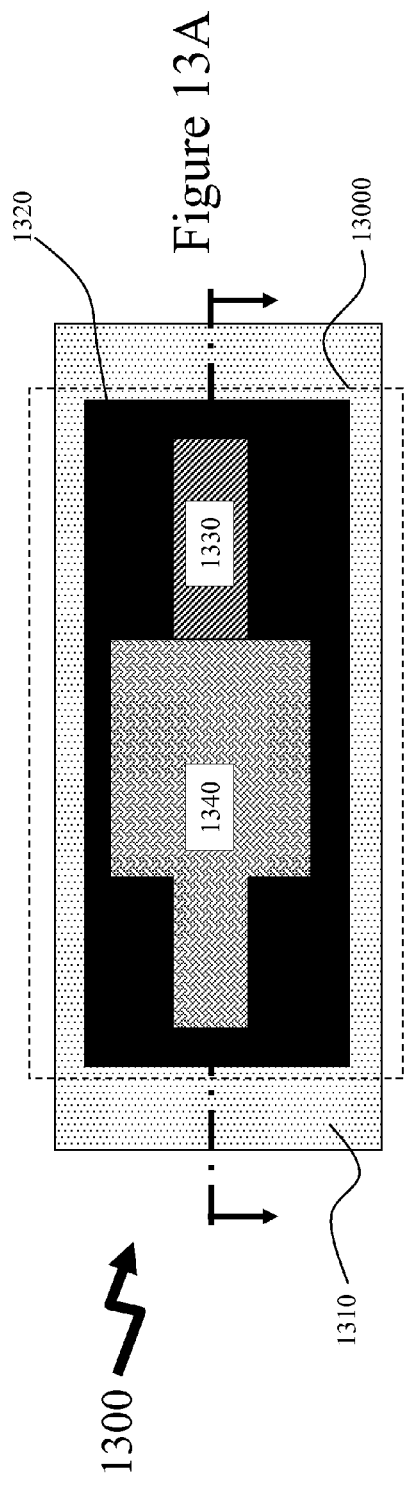
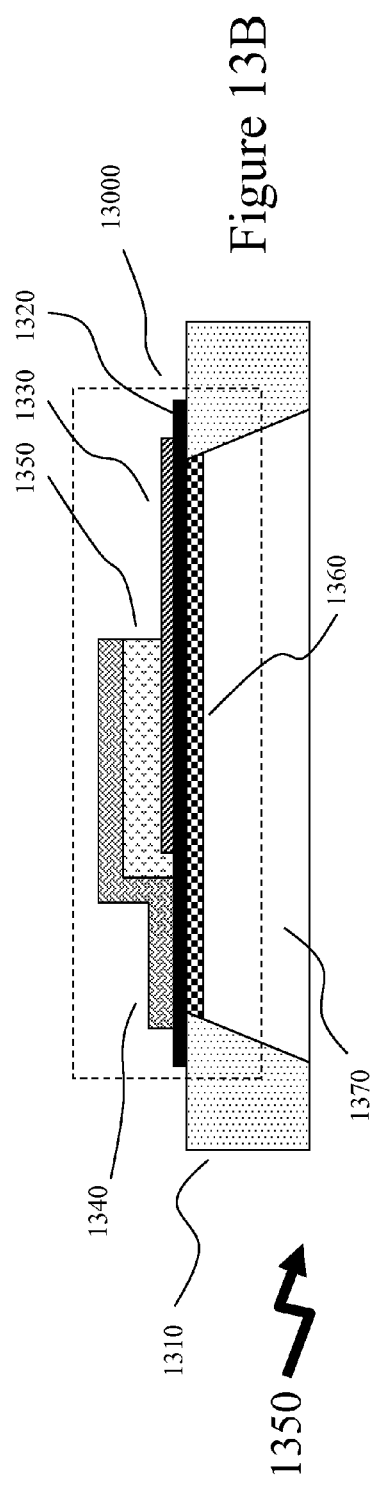
Figure 13A
Figure 13B

LOW-TEMPERATURE WAFER LEVEL PROCESSING FOR MEMS DEVICES

CROSS-REFERENCE TO RELATED APPLICATIONS

This application claims the benefit of priority from U.S. patent application Ser. No. 12/922,224 filed Sep. 13, 2009 entitled "Low Temperature Wafer Level Packaging for MEMS Devices" as a divisional application as the result of election/restriction requirement issued May 5, 2011. U.S. patent application Ser. No. 12/922,224 itself claims benefit of priority to International Patent Application Serial No. PCT/CA2009/000,292 filed Mar. 11, 2009 entitled "Low Temperature Wafer Level Packaging for MEMS Devices" and published as WO/2009/111,874. This International Patent Application claims benefit of priority to U.S. Provisional Patent Application Ser. No. 61/064,534 filed Mar. 11, 2008 entitled "Low Temperature Wafer Level Packaging for MEMS Devices" and U.S. Provisional Patent Application Ser. No. 61/129,909 filed Jul. 29, 2008 entitled "Low Temperature Wafer Level Packaging for MEMS Devices."

FIELD OF THE INVENTION

The invention relates to the packaging of microelectromechanical devices (MEMS) and more particularly to providing ceramic structural elements within the packaging of said MEMS devices

BACKGROUND OF THE INVENTION

Microelectromechanical systems (MEMS) are small integrated devices or systems that combine electrical and mechanical components. The components can range in size from the sub-micrometer level to the millimeter level, and there can be any number, from one, to few, to potentially thousands or millions, in a particular system. Historically MEMS devices have leveraged and extended the fabrication techniques developed for the silicon integrated circuit industry, namely lithography, doping, deposition, etching, etc. to add mechanical elements such as beams, gears, diaphragms, and springs to silicon circuits either as discrete devices or in combination with integrated silicon electronics. Whilst the majority of development work has focused on silicon electronics additional benefits may be derived from integrating MEMS devices onto other existing electronics platforms such as silicon germanium (SiGe), gallium arsenide and, indium phosphide for RF circuits and future potential electronics platforms such as organic based electronics, nanocrystals, etc.

In the field of radio frequency integrated circuits (RFIC), microelectromechanical systems (MEMS) are currently gaining momentum. The current design trend leans towards system-on-chip (SOC) implementations in which electronics and MEMS are integrated on a single die. For RF applications, high quality filters and resonators must typically be implemented as bulky off-chip surface-acoustic wave (SAW) filters to achieve a satisfactory quality factor (Q-factor). However, current advances in MEMS technology make it possible to implement such elements on-chip with a comparable Q-factor, provided proper packaging is available. The Q-factor of a MEMS resonating device is strongly dependent on the level of vacuum in its environment. Indeed, reduced pressure minimizes air resistance, resulting in smaller damping of the mechanical structure's vibration.

Additionally, and beneficially, MEMS device applications today also include inkjet-printer cartridges, accelerometers, miniature robots, micro-engines, locks, inertial sensors, micro-drives, micro-mirrors, micro actuators, optical scanners, fluid pumps, transducers, chemical sensors, pressure sensors, and flow sensors. New applications are emerging as the existing technology is applied to the miniaturization and integration of conventional devices. These systems can sense, control, and activate mechanical processes on the micro scale, and function individually or in arrays to generate effects on the macro scale. The micro fabrication technology enables fabrication of large arrays of devices, which individually perform simple tasks, or in combination can accomplish complicated functions.

MEMS have become a successful sensing and actuating technology. Because of their extensive optical, electrical to mechanical functionalities, MEMS devices are suited to applications in many different fields of science and engineering. However, because of this vast range of functionality, MEMS fabrication processes, unlike the microelectronics industry, are difficult to gear towards general applications. As a result, most processes are aimed at the fabrication of a few devices, and usually performance of the devices is hindered by process variability. As MEMS devices are typically sensing weak analog signals, for example pressure, acceleration, vibration, magnetic or electric fields, with capacitive based elements, there is considerable benefit in being able to integrate analog front-end electronics to buffer, amplify and process these weak electronic signals and either facilitate their direct processing, such as with RF signals, or their digitization for sensing and measurements applications.

Chip Level Packaging and Wafer Level Packaging

Consequently, packaging of the MEMS is of critical importance, since it must ensure a stable high-vacuum environment. Vacuum packaging is usually performed at the chip level, meaning that each chip is individually enclosed in a hermetic package which is sealed with vacuum inside. For all its widespread use, chip-level packaging (CLP) presents significant drawbacks that make it particularly costly, including:
1) Very expensive hermetically sealable packages are required.
2) The chips must be encapsulated individually rather than by means of a batch process. This lengthens the production time of the system, thereby increasing costs.
3) The fragile MEMS devices are not protected during dicing and wire bonding, which has a negative impact on the yield, thus incurring greater costs.

In fact, the costs of using CLP for hermetical packaging can exceed any other costs involved in the design of a MEMS system. As such it would be beneficial to replace CLP with a wafer-level packaging (WLP) process, particularly applications requiring very low pressure or vacuum environments around the MEMS device such as resonators. Whilst a WLP process is more complex to develop than CLP, it does present various worthwhile advantages because it allows batch encapsulation at the wafer scale. With WLP, the encapsulation of MEMS devices effectively becomes part of the microfabrication cycle rather than a post-process operation, i.e. the different chips on a wafer do not need to be enclosed individually, particularly in a vacuum, because they are all processed simultaneously. This makes such a WLP process more efficient as well as cheaper for mass production. After the WLP process is complete, the encapsulated chips can still be packaged in a conventional manner. However, the external package is neither responsible for hermetically preserving a vacuum environment nor ensuring the fine mechanical protection of the MEMS devices: all this is performed by the WLP encapsulation. The only potential purpose of this package (if used at all) is to provide an electrical interface and coarse mechanical protection. Hence, inexpensive standard packages can be used instead of customized CLP solutions. Alternatively, an attractive option is to surface mount the WLP-encapsulated MEMS chip directly to the PCB, totally circumventing the need for an external package, an option which is not available with CLP.

Further with WLP, because the MEMS are protected at an earlier stage of the micro-fabrication cycle, the overall processing yield is improved, thereby lowering cost. Indeed, the released devices are encapsulated before the chips are even diced, which prevents the fragile structures from being damaged by dust and debris. Furthermore, this WLP process is advantageous in terms of testability. Indeed, MEMS devices requiring vacuum to operate satisfactorily must be encapsulated before electrical testing can be performed. With CLP, expensive enclosures are wasted to test faulty devices, since each die must be fully packaged before it can be verified. On the other hand, WLP allows devices to be tested at the wafer-level using a probe station without the need for any test fixture, since the devices are already encapsulated in vacuum before dicing. Therefore, malfunctioning devices can be conveniently singled out, so that only the operational devices are further processed.

It would be beneficial for the WLP process to minimize the processing temperatures involved, in the goal of allowing maximal compatibility with a large number of custom MEMS processes, even if metal interconnects with a low melting point are present, as well as allowing the WLP process to package devices requiring low processing temperatures from the presence of CMOS electronics. Such an overall low temperature process providing a route to system-on-chip implementations.

Low Temperature Ceramic MEMS Materials

Within the prior art the vast majority of research and current commercial products has been undertaken on silicon due to the availability of a manufacturing and process infrastructure from electronics However, the mechanical properties of silicon do not make it the most suitable structural material for MEMS. Recently, silicon carbide (SiC) has generated much interest as a MEMS structural material because of its distinctive properties. SiC offers improved mechanical properties such as higher acoustic velocity, high fracture strength and desirable tribological properties. Its ability to sustain higher temperatures, and resist corrosive and erosive materials makes SiC, unlike conventional silicon which is employed in CMOS electronics as the substrate material. As such SiC offers potential as a candidate material for use in harsh environments. These factors, along with the maturation of deposition techniques, make SiC a potential choice for high-performance MEMS processing.

However, difficulties with SiC processing have made its use non-trivial as it is non-conductive and difficult to deposit and dope at temperatures compatible with CMOS electronics. Stress control is also difficult because of the high intrinsic stresses that can develop in such a material. Because of its intrinsic inertness, selective etching of SiC is difficult. As most materials are etched at a faster rate than SiC, issues arise when masking SiC for patterning and ensuring a reliable etch-stop. Whether it is for doping or for deposition, SiC needs to generally be processed at high temperatures. As such prior art SiC MEMS processes have not lent themselves well to CMOS integration. Further as most MEMS applications require electrical signal processing, integration of MEMS to transistor-able processes, such as CMOS, is paramount.

As outlined in U.S. patent application Ser. No. 12/341,013 filed Dec. 21, 2008 "Low Temperature Ceramic Microelectromechanical Structures" by F. Nabki and T. Dusatko, a low temperature silicon-carbide MEMS manufacturing process is taught. The processes providing for MEMS manufacturing processes with maximum temperatures below 350° C., and even 250° C. Therefore, it would be beneficial to have a WLP packaging process for these MEMS processed devices that allows for manufacturability and integration of SiC with silicon CMOS electronics to be sustained and thereby effectively harness the benefits of SiC.

Further, the WLP packaging process as will be described with respect to different exemplary embodiments of the invention are not limited to a single application and can be applied to a vast number of surface-micromachining MEMS processes, materials, and device designs. The benefit of compatibility with the low temperature SiC processes for direct MEMS integration also allows its use with more conventional MEMS processes at substantially higher temperatures.

Electrical Interconnection and Mechanical Integrity

Within CMOS electronics, it is common to employ vertical feed-throughs that are beneficially employed through the whole thickness of the silicon substrate wafer. This creates a direct electrical contact from the lower side of the silicon wafer to the encapsulated MEMS. This beneficially removes the requirement for MEMS electrical interconnections to the outside of the cavity on the same upper side of the silicon wafer. Such an interconnection that would traverse through the wafer bonding interface between the silicon substrate and the cover wafer providing the hermetic seal, and cause topography and sealing issues. Accordingly, vertical feed-throughs improve the quality of the bond by eliminating irregularities, thereby improving the encapsulation hermeticity and yield. Furthermore, the interconnect parasitics are reduced by such an interconnection scheme.

Further such vertical feed-throughs beneficially allow the electrical contacts to be on the lower side of the substrate, allowing the chips to be directly mounted to a PCB or to another semiconductor chip. When mounted, the devices still face the upward orientation, which is particularly beneficial for devices providing sensing functionality requiring access to the upper surface of the MEMS by gas or liquid flow, as well as those addressing optical applications i.e. micro-optical-electromechanical systems (MOEMS) because light can reach the MEMS directly from above.

However, the provisioning of vertical feed-throughs through the thickness of the substrate provides two drawbacks within the prior art. Firstly, the inner surfaces of the vertical feed-through are coated with a thin layer of metallization to provide the contact path from the upper surface to the lower surface. Such thin metallizations toward the narrower apex of the vertical feed-throughs form sealing membranes of the overall packaged silicon circuit and MEMS structure. Such membranes form one potential point of failure for the packaged component due to rupturing, gas transport, etc.

Secondly the removal of large portions of the silicon substrate beneath the MEMS device results in a weakening of the mechanical integrity and impacts the performance of the MEMS device. Accordingly it would be beneficial to provide a reinforcement of the sealing membranes and silicon substrate with the in-filling of the vertical feed-through structures with a material providing mechanical integrity that is compatible with the overall process flow in respect of material parameters, processing temperature etc. Also, it would be beneficial to provide a method to create these membranes with fine resolution and accuracy to reduce their size, and hence minimally affect the MEMS mechanical integrity and performance. This is accomplished by the use of anisotropic etching and precise alignment methods.

It would therefore be beneficial to provide a method of processing and packaging MEMS devices that allows for their encapsulation in a wafer level process. It would be further beneficial for the method to be compatible with low temperature processing for MEMS devices fabricated directly onto CMOS electronics. Additionally benefit would be further achieved if the method supported provisioning of through-wafer electrical interconnects with improved mechanical integrity and improved performance as a barrier to high pressure differentials where the encapsulated MEMS is either under low pressure, vacuum, or pressurized.

SUMMARY OF THE INVENTION

In accordance with an aspect of the invention there is provided a method Comprising providing a first substrate, the first substrate comprising at least one feed-through of a plurality of feed-throughs through the thickness of the first substrate from a first surface to a second surface; providing electrical interconnection by way of the at least one feed-through of a plurality of feed-throughs from the first surface to the second surface; and fabricating at least one MEMS device of a plurality of MEMS devices directly onto the second surface of the first substrate. The method further comprising providing a second substrate, the second substrate comprising at least one recess of a plurality of recesses dimensioned so as to accept the MEMS device fabricated on the first substrate; positioning the second substrate with respect to the first substrate such that the at least one MEMS device of a plurality of MEMS devices is thereby contained within a cavity formed by the first substrate and the at least one recess of a plurality of recesses; and bonding the second substrate and first substrate together.

In accordance with another aspect of the invention there is provided a method comprising providing a substrate; fabricating within the substrate a via of a plurality of vias, each via comprising at least an etched feature and providing at least a first opening in a first surface of the substrate and a second opening in a second surface of the substrate; metallizing a first predetermined portion of the via; and in-filling a second predetermined portion of the via with a ceramic material.

In accordance with another aspect of the invention there is provided a method comprising providing a substrate; fabricating a recess within the substrate, the recess comprising at least a first opening in a first surface of the substrate and having a predetermined depth from the first surface of the substrate to a second surface of the substrate; and in-filling a predetermined portion of the recess with a ceramic material.

In accordance with another aspect of the invention there is provided a method comprising: providing a substrate, the substrate comprising at least a first surface, a second surface, and at least a CMOS electronic circuit of a plurality of CMOS electronic circuits integrated onto the second surface; and fabricating at least one via of a plurality of vias in the substrate, the via comprising at least a first opening in the first surface of the substrate, a second opening in the second surface of the substrate, and a metallization over at least one sidewall of the plurality of sidewalls of the via. The method further comprising in-filling a first predetermined portion of the plurality of vias with a ceramic material; providing at least one electrical contact pad of a plurality of electrical contact pads on the first surface of the substrate, each electrical contact pad associated with a predetermined via of the plurality of vias; and fabricating at least a MEMS device of a plurality of MEMS devices, each MEMS onto the fabricated with a low temperature MEMS process incorporating at least one structural layer and having a maximum temperature exposure to the substrate of at least one of 250° C. and 350° C. The method further comprising electrically interconnecting the plurality of vias, the plurality of MEMS device, and the plurality of CMOS electronic circuits according to a predetermined relationship.

BRIEF DESCRIPTION OF THE DRAWINGS

Exemplary embodiments of the invention will now be described in conjunction with the following drawings, in which:

FIGS. 12A and 12B depict an embodiment of the invention wherein a low temperature ceramic insert reinforces a membrane structure within an integrated circuit for a heater structure;

FIGS. 13A and 13B depict an embodiment of the invention wherein a low temperature ceramic insert supports a thin-film bulk acoustic wave resonator.

DETAILED DESCRIPTION OF EMBODIMENTS OF THE INVENTION

Figure 1:
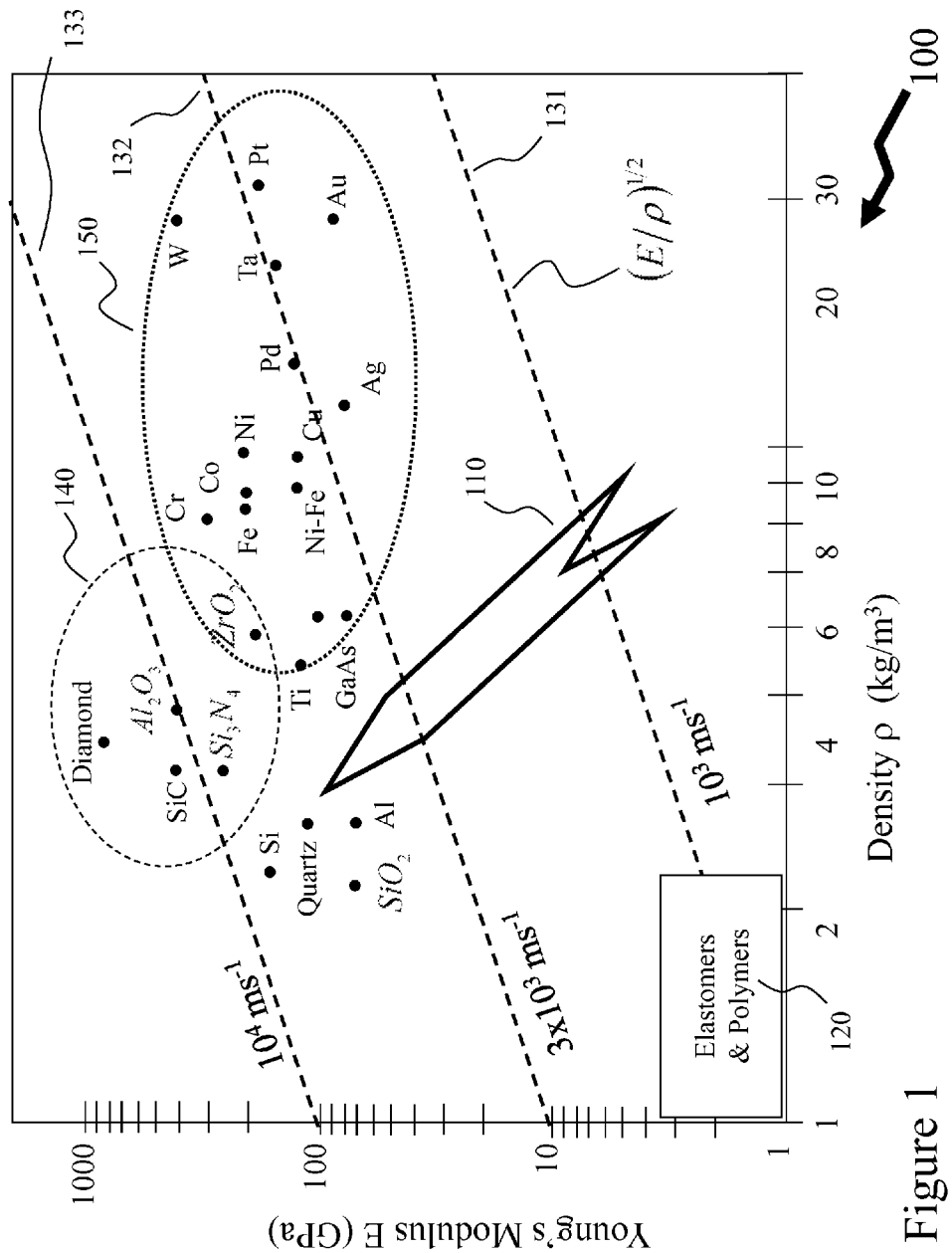
FIG. 1 illustrates the benefits of SiC for MEMS device implementations over Si.

Referring to FIG. 1 shown is a material selection chart 100 for MEMS device implementations. Plotted onto the material selection chart are a range of different materials including metals, dielectrics, ceramics and polymers. Each material being represented by a point on the X-Y graph wherein the X-axis is density and Young's modulus is the Y-axis. The data being plotted is according to the work of V. T. Srikar et al "Materials Selection in Micro-Mechanical Design An Application of the Ashby Approach" (J. Microelectromechanical Systems Vol. 10, No. 1, pp. 3-10). As acoustic velocity, a factor governing the resonant frequency of structural materials, is determined in accordance to Equation 1 below shown are lines of constant acoustic velocity 131, 132, 133 of $1\times10^3$ ms$^{-1}$, $3\times10^3$ ms$^{-1}$, and $1\times10^4$ ms$^{-1}$ respectively.

$$v=\sqrt{E/\rho} \qquad (1).$$

As evident from the material selection chart, different types of materials tend to be grouped together. Ceramic materials 140 tending to appear in the top left, metals 150 appearing in the middle-right, whilst polymers and elastomers 120 are grouped together in the bottom-left. The trend arrow 110 indicates the direction of preference for selecting materials for MEMS application in having high Young's modulus and low density. Accordingly, from material selection chart 100 better alternatives to silicon (Si) would include silicon carbide (SiC), alumina ($Al_2O_3$) or diamond (C). Of these three, SiC represents an interesting choice as the processing technology it requires is relatively mature, albeit with issues identified supra in respect of compatibility of processing temperatures with CMOS electronics for current techniques.

Figure 2A:
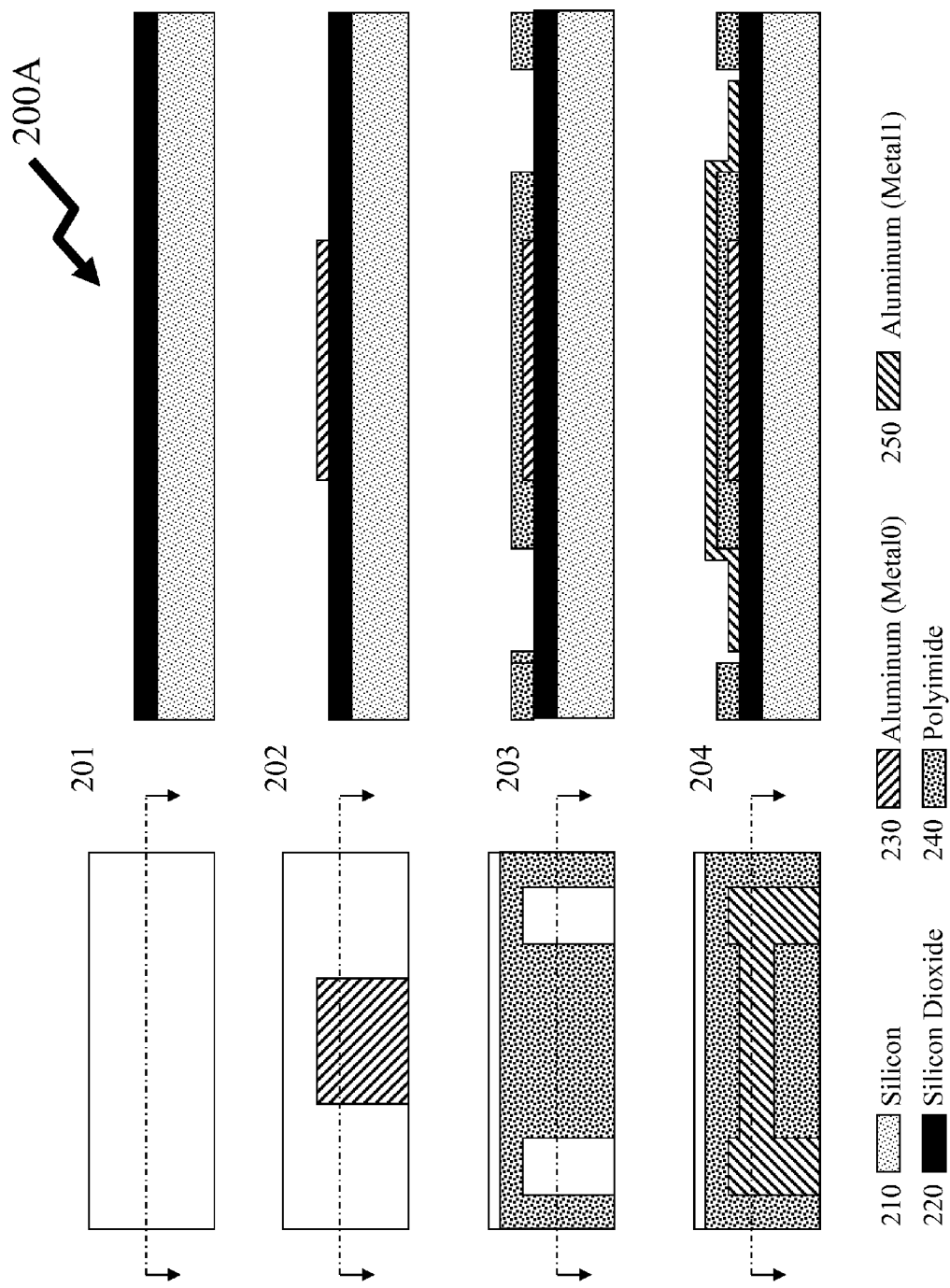
FIGS. 2A and 2B illustrate an exemplary flow diagram for manufacturing a low temperature SiC MEMS device.
Figure 2B:
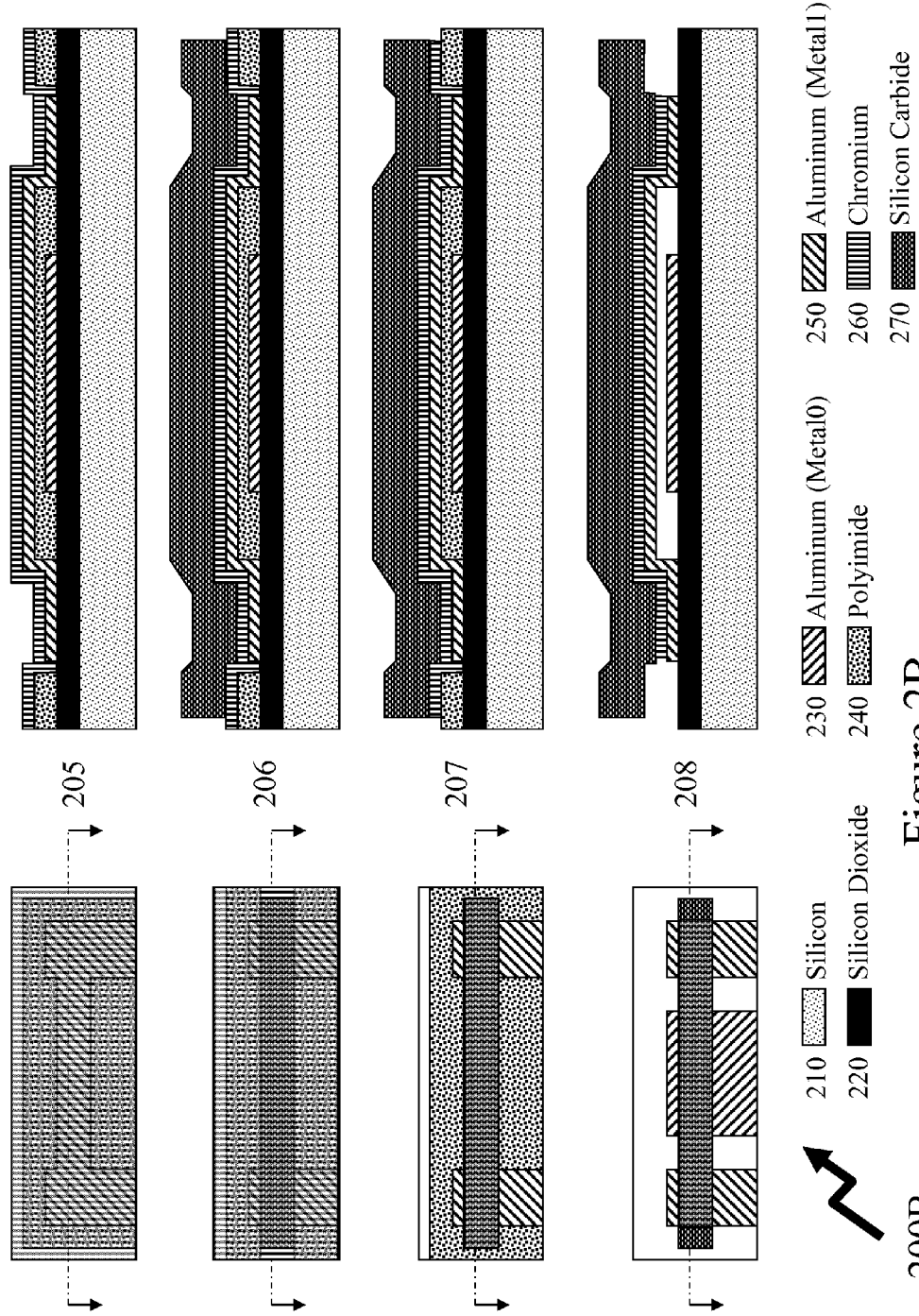

Now referring to FIG. 2A and FIG. 2B there is depicted an exemplary process flow for the manufacture of a low temperature SiC MEMS device onto a silicon integrated circuit containing CMOS electronics. For the SiC MEMS device this means that an important aspect of the manufacturing relates to the method of forming the structural material through consideration of several factors including:

intrinsic stress control for low stress films to prevent structural buckling or fracture, ability for small (<200 nm) gap to allow for effective electrostatic coupling, CMOS-compatible deposition temperature, and low-cost deposition technology that allows for manufacturability.

In considering SiC, a critical aspect of the implementation of MEMS devices is the deposition of the core structural SiC layers. Within the prior art SiC has been traditionally deposited using one of four different methods:

1) low-pressure chemical vapor deposition (LPCVD);
2) atmospheric pressure chemical vapor deposition (APCVD);
3) plasma-enhanced chemical vapor deposition (PECVD); and
4) magnetron enhanced sputtering.

Both LPCVD and APCVD have been used to successfully deposit SiC films; however, these reactions are usually highly endothermic and yield poor stress control, hence requiring deposition temperatures typically of 800° C. to 1300° C. As a result of these high temperatures, no known method to date has allowed for post-CMOS integration using APCVD or LPCVD of SiC. Furthermore, the deposition rate is typically very low since the overall reaction is limited by the surface reaction rate.

PECVD which uses RF-induced plasma to transfer energy to the reactant gases allows the substrate to remain at a much lower temperature. Using this technique, low temperature deposition is possible. The composition of SiC deposited at these relatively low temperatures is amorphous or polycrystalline with crystal grains present in increasing quantity as the deposition temperature is increased. Residual stresses in deposited films, however, are typically very high, and therefore a CMOS incompatible post-deposition high temperature annealing is required.

For SiC deposition to provide structural layers in MEMS, the inventors have demonstrated that by exploiting DC magnetron enhanced sputtering not only can the processing be performed at room temperature, but that this can yield good stress control and no special CVD processes are required. DC sputtering may also be used for all metal depositions for upper and lower metallizations to the ceramic layer demonstrating a significant minimization in the amount and cost of equipment needed to implement the process, and render it less hardware dependent for enhanced manufacturability. Sputtering is typically performed by bombarding a SiC target with positive argon ions created in a plasma. These incident ions sputter away material by physical momentum transfer, which then condenses onto the substrate. Since this is a purely physical process, no external heat source is required and the process can be performed at room temperature; however, the substrate temperature will rise marginally due to bombardment by secondary electrons, and neutral atoms. As a result according to embodiments of the invention the maximum temperature of the substrate measured may be limited to below 200° C., which is considerably lower than most CVD processes, and can be reduced further at the cost of lower throughput if thermal relief pauses are taken during deposition. Another advantage of physical sputtering is that deposited films are conformal and adhere well to the substrate. It has a relatively high deposition rate, and residual stresses can be nearly eliminated by careful selection of the process parameters.

Further, the embodiments of the invention provide for a low temperature MEMS structural deposition process that is relatively simple, low-cost, and can be performed using only argon gas and a sintered SiC target. Beneficially the SiC from the process is amorphous, has isotropic material properties, maintains its high elastic modulus, hardness and inertness but is non-conductive thereby allowing the isolation of electrical contacts on one surface or between top and bottom surfaces. According to embodiments of the invention, these interconnects are metal-based in order to maintain the low thermal loading to the Si CMOS circuits. This has the added benefit of lower resistance interconnects as metal conductivities are orders of magnitude better than doped semiconductors, and achieves low resistive energy losses that improves quality factor performance of devices such as MEMS variable capacitors, switches, inductors or resonators. Alternatively, in other embodiments with reduced thermal constraints doping can be employed to provide these interconnects to the SiC structural elements.

Accordingly, a manufacturing process flow is presented in respect of FIGS. 2A and 2B, illustrating an embodiment of the invention to providing MEMS SiC on Si CMOS. Referring to FIG. 2A the initial process steps are shown in plan and cross-sectional views 200A. In first step 201 the silicon wafer 210 is coated with a 2.5 µm layer of silicon dioxide 220 to reduce electrical feed-through from the electrical interconnects of the MEMS structure to the Si CMOS within the silicon wafer 210. This layer can be removed in another embodiment of the invention when applied directly onto a processed CMOS substrate's passivation or planarization layer such as phosphosilicate glass, silicon oxide, or nitride. In the second step 202 interconnect/ground metallization is formed onto the upper surface of the 2.5 µm layer of silicon dioxide 220 by depositing 60 nm of aluminum (Metal 0) 230 and wet etching to form the electrical pattern required.

Next in the third step 203 a 0.2 µm polyimide layer 240 is deposited and patterned. The 0.2 µm polyimide layer 240 being sacrificial to release the MEMS resonator as finally formed. On top of the sacrificial polyimide layer 240 further 60 nm aluminum layer (metal 1) 250 is deposited and patterned in step 204. The 60 nm aluminum layer (metal 1) 250 forming the lower side metallization of the MEMS structure, in this case the beam interconnect layer.

Now referring to FIG. 2B the final process steps are shown in plan and cross-sectional views 200B. Next at step 205 an 80 nm SiC etch-stop blanket layer of chromium layer 260 is deposited across the surface of the wafer. Next in step 206 a 2 µm SiC MEMS structural layer 270 is deposited and patterned using reactive ion etching in a $NF_3$ environment. At this point an aluminum layer for pad creation or interconnect resistance reduction can be patterned. Next in step 207 the exposed chromium layer 260 is etched using a conventional wet etchant. Finally in step 208 the polyimide sacrificial layer 240 is removed from the wafer using a dry oxygen plasma process. The result in the embodiment described being to release the beam in this example of the MEM resonator. The release etch also removes any remaining exposed chromium layer 260 from under the SiC MEMS structural layer 270 where no aluminum layer (metal 1) 250 is patterned.

It will be evident that the exemplary embodiment presented in respect of FIGS. 2A and 2B provides for three metal layers for routing signal and actuation voltages, one being the aluminum (metal 0) 230 direct to the Si CMOS substrate surface, the second being aluminum (metal 1) 250 on the underside of the SiC MEMS structural layer 270, and the third being a metal 2 layer formed onto the upper surface of the SiC MEMS structural layer 270. Such a metal 2 layer not shown within the embodiment presented.

Further the exemplary embodiment presented in respect of FIGS. 2A and 2B being a MEMS resonator is just one possible application of the process where flexibility of three metal layers and SiC MEMS structural layer exist. Optionally the aluminum may be replaced with tungsten or other electrical interconnect materials in dependence upon the environmental and chemical aspects of the environment within which the MEMS device is intended to operate.

Figure 3:
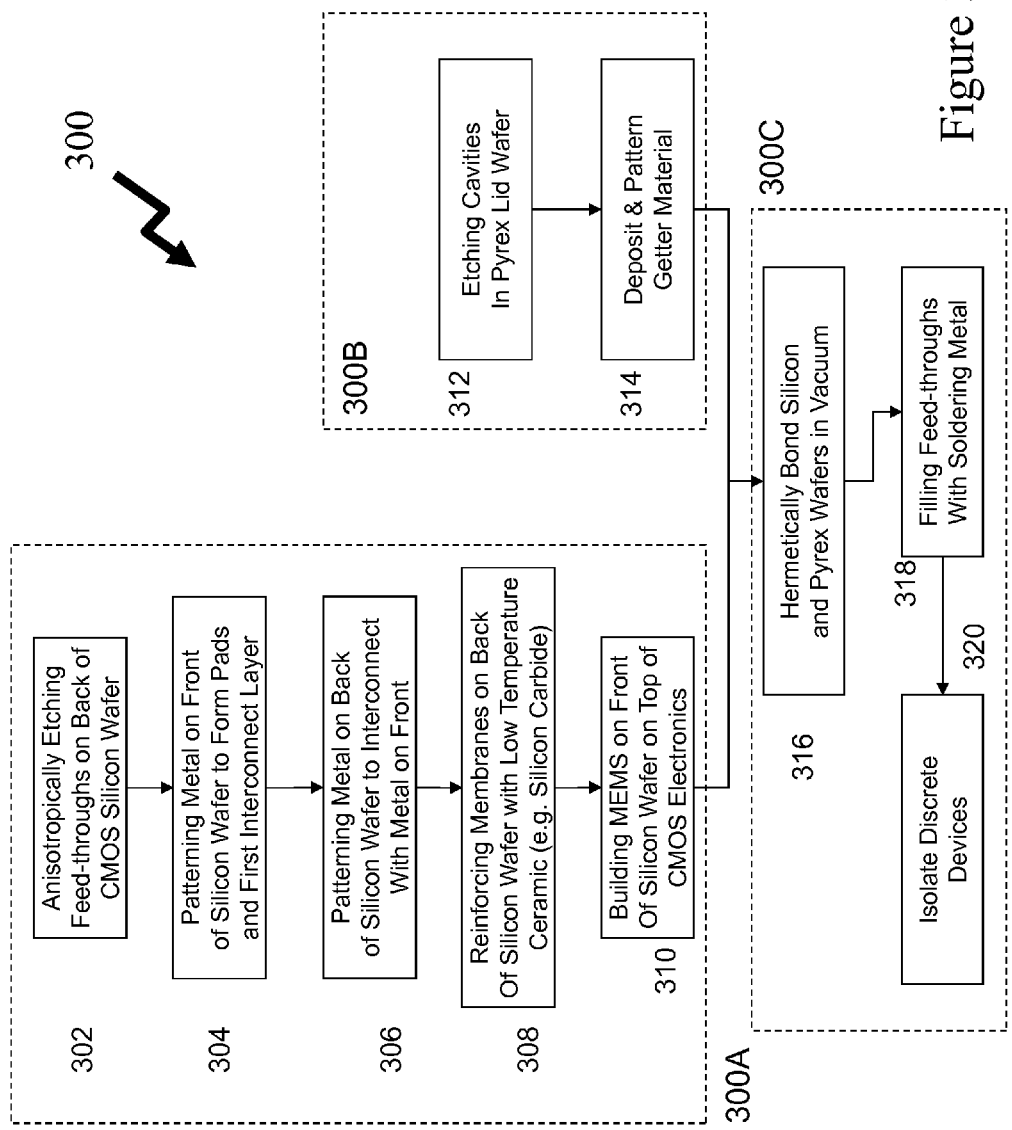
FIG. 3 illustrates an exemplary flow diagram of the process steps for the manufacturing of a CMOS MEMS wafer and its wafer level packaging.

FIG. 3 illustrates an exemplary flow diagram 300 of the process steps for the manufacturing of a CMOS MEMS wafer and its wafer level packaging. The exemplary flow diagram 300 begins with a first flow 300A at step 302 with anisotropically etching feed-throughs into the back of the CMOS silicon wafer. The front of the silicon wafer is now metalized and patterned in step 304 to provide the interconnection pads and first layer interconnect, such as aluminum 230 in FIG. 2A. Next in step 306 the back surface of the silicon wafer is metalized and patterned to interconnect with the metal on the front surface.

Next in step 308 reinforcing membranes are provided within the bottom of the feed-through vias using a low temperature ceramic, such as silicon carbide. This is followed in step 310 with the manufacturing of the low temperature MEMS onto front surface of the silicon wafer, and atop the CMOS electronics. The low temperature MEMS being manufactured for example by the exemplary SiC process outlined supra in respect of FIGS. 2A and 2B. At this point first flow 300A has resulted in the provisioning of a finished silicon wafer with integrated CMOS electronics, through-wafer vias, and low temperature ceramic MEMS devices integrated to the upper surface.

Now in second flow 300B a wafer, for example of Pyrex®, is etched in process step 312 with a pattern of cavities that match the pattern of discrete devices within the silicon wafer processed in first flow 300A. Next in process step 314 a getter material is deposited and patterned into the bottom of each cavity. Examples of getter materials include zirconium, titanium, vanadium, and iron.

In third process flow 300C the silicon wafer from first flow 300A and the Pyrex® wafer from the second flow are brought together in step 316 wherein the Pyrex® and silicon wafers are hermetically sealed one to the other in a vacuum. Next in step 318 the feed-throughs in the silicon wafer are filled with solder whereupon the assembled wafer pair is then processed to separate the individual devices from the wafer pair in step 320.

Optionally the Pyrex® wafer processed in second flow 300B may have an additional processing step providing metallization interconnects onto the Pyrex® such that they interconnect to metallization tracks on the silicon wafer, and a heater structure beneath the getter material. Appropriate selection of the metallization for these heater structures allows the use of getter materials that require a high temperature firing in order to achieve the necessary gettering of residual gases, either from within the sealed cavity or outgassed gases from the processed silicon wafer. It would also be evident that the separation of the individual devices may be eased by providing deep etched structures within the Pyrex® wafer.

Figure 4:
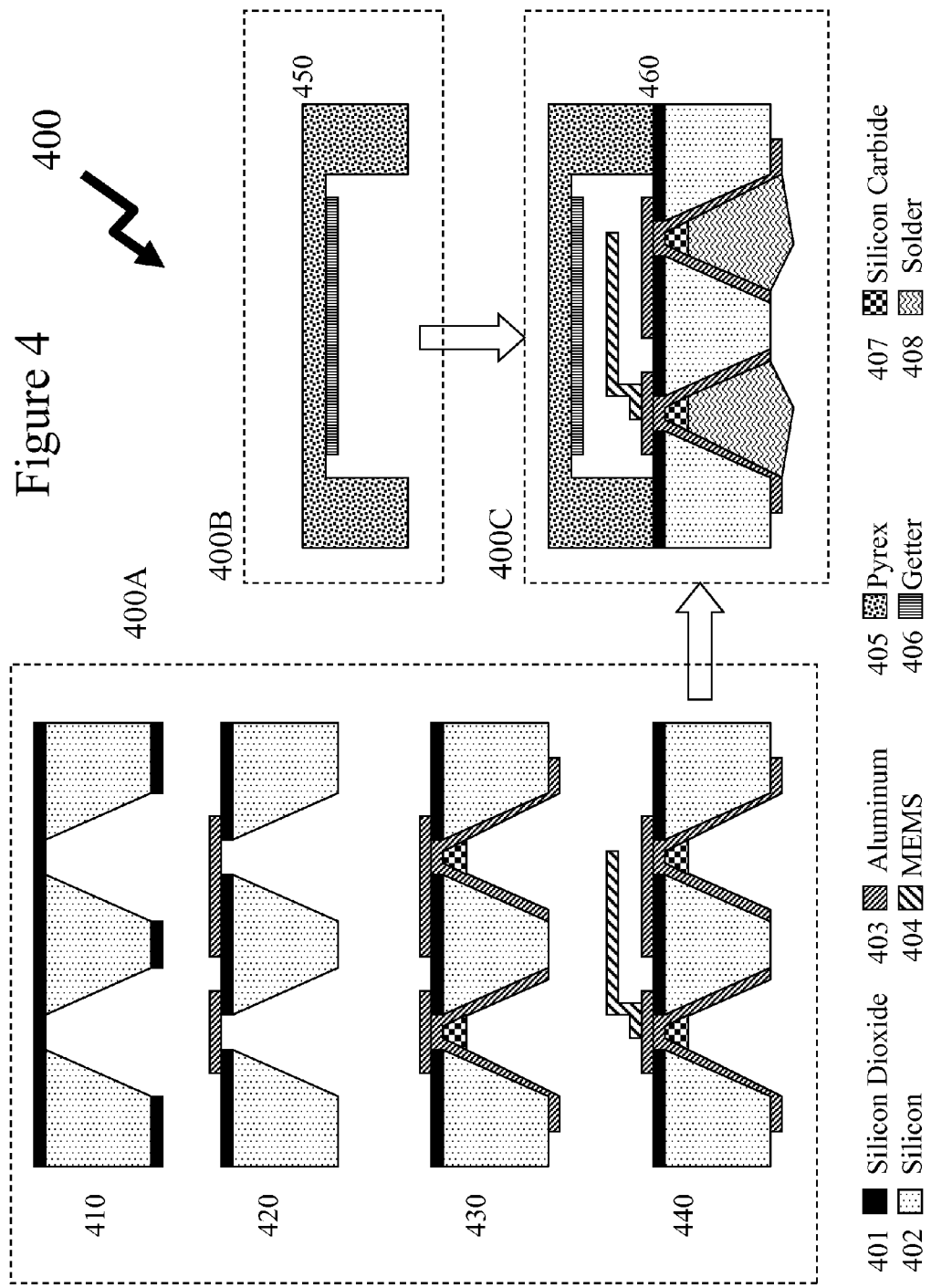
FIG. 4 illustrates the exemplary flow diagram of FIG. 3 in cross-section view of an exemplary silicon wafer with MEMS devices fabricated thereupon.

Now referring to FIG. 4 there is illustrated the exemplary process flow 300 of FIG. 3 as cross-sectional views of a silicon wafer in device flow 400A. Device flow 400A starts with silicon device flow 400A where a silicon wafer 402 is patterned with silicon dioxide 401 and through wafer feed-throughs are subsequently etched yielding etched silicon wafer 410. Next the silicon wafer 402 is metalized with aluminum 403 and the silicon dioxide 401 removed as required from the front and back surfaces to give metalized silicon wafer 420. Next the feed-throughs are metalized with aluminum 403 and the bottoms of these filled with silicon carbide 407 to give reinforced silicon wafer 430.

Now the reinforced silicon wafer 430 is processed according to a MEMS manufacturing process to provide MEMS 404 onto the upper side of the silicon wafer 402. As a result the device flow 400 results in MEMS integrated silicon wafer 440. Meanwhile in lid flow 400B the Pyrex® 495 is etched to provide the cavities and the getter 406 is deposited and patterned within these cavities. These steps resulting in gettered lid wafer 450.

Subsequently the MEMS integrated silicon wafer 440 and gettered lid wafer 450 are brought together in assembly flow 400C and bonded one to another under a vacuum. Subsequently the wafer feed-throughs are filled with solder 408. The final result from assembly flow 400C being hermetically packaged MEMS devices integrated onto a silicon wafer, sealed wafer 460.

Within the embodiment described supra with respect to FIG. 4 the sealing of the gettered lid wafer 450 to the MEMS integrated silicon wafer 440 is described as being performed under a vacuum. Such a requirement exists where the MEMS 404 is for example an oscillator or resonator structure. Alternate MEMS devices may not require a vacuum in the packaging step but may alternatively be sealed under atmospheric pressure with dry nitrogen, or a specific gas chemistry if beneficial. Optionally the Pyrex® 405 may be etched to provide features accepting gas inlet and outlet valves wherein the MEMS performance adjusts according to the flow, pressure, or other property of the gas fed to the cavity, or specific gaseous elements such as in sensor applications.

Process Description—

The exemplary process flow 300 and device flow 400 will now be described with reference to one exemplary manufacturing sequence. The sequence initiates with growing a 2.5 µm-thick thermal silicon dioxide (SiO$_2$) layer on the front and on the back of a blank 675 µm-thick <100> Si wafer. The oxide on the back of the wafer is patterned by reactive-ion etching (RIE) so as to create a hard mask for subsequent bulk Si etching. The etch uses a mixture of CHF$_3$, Ar and CF$_4$ gases to attack the oxide. The wafer is then placed into 25% tetramethyl ammonium hydroxide ((CH$_3$)$_4$NOH, commonly referred to as TMAH) solution to anisotropically etch pyramidal holes through the whole thickness of the silicon, leaving a thin 2.5 µm-thick SiO$_2$ membrane on the front side.

Subsequently, aluminum (Al) is sputtered on the front of the wafer and patterned by standard wet etching to form the electrical interconnection layer and the pads for the selected surface-micromachining MEMS process. The location of the pads corresponding to the openings of the pyramidal feed-throughs on the front side of the wafer. Furthermore, the Al pads have a greater area than the openings and extend farther all around so that the holes are fully covered.

The typical flow of the selected surface micromachining process is then interrupted to sputter an approximately 2 µm-thick layer of silicon carbide (SiC), which is then RIE patterned using NF$_3$ with the help of a chromium (Cr) hard mask. After this, SiC fully covers the Al pads, thereby structurally reinforcing the suspended membranes. Next, the thermal SiO$_2$ on the membranes is RIE etched from the back of the wafer using CHF$_3$, Ar and CF$_4$. Then, Al is sputtered on the back of the wafer and wet patterned in order to create electrical contacts to the pads on the front of the wafer. The typical flow of the MEMS process can then be resumed until the fabrication of the devices is complete. RIE etching is then used to remove the exposed SiO$_2$ layer on the front of the wafer, so as to make the surface suitable for anodic bonding.

In parallel to the processing of the active wafer, a 600 nm thick Cr film is deposited on a borosilicate glass wafer (of which one common trade variety is Pyrex®) and wet-patterned to serve as a hard mask for bulk etching of the glass. According to the design of the circuit to which the cover is intended to be applied the depth of the cavity to be formed within the borosilicate wafer is determined. Equally the design may call for multiple cavities per integrated circuit die to minimize the volume of the cavity. Typically a 5 µm deep cavity would be RIE etched in the borosilicate glass wafers using SF$_6$ and Ar gases. Subsequently, the Cr hard mask is entirely removed by standard wet etching. Finally, the active and cover wafers are cleaned with solvents (for example acetone and propanol) and anodically bonded together in a very low-pressure environment, thereby sealing the devices in high vacuum micro-cavities. Electrical contacts with the devices are available from the backside of the Si wafer.

Since the MEMS devices are to be sealed in hermetic cavities, an appropriate method must be used to provide an interface to allow electrical communication with the external system. A convenient solution is to create conductive vias through the entire thickness of the Si active wafer. TMAH, an anisotropic wet etchant, is used to etch feed-throughs from the back of the wafer. Because of the <100> crystalline orientation of the Si wafer and the anisotropic nature of the etch, a square hard mask opening results in a pyramidal feed-through with sidewall angle of 54.74° corresponding to the <111> plane of the crystal. Such angled sidewalls providing an advantage when the time comes to deposit the conductive Al layer inside the feed-throughs, and enhancing control of the alignment of the resulting membranes Such that smaller area membranes may be used, improving mechanical strength.

With a narrow vertical feed-through, an important concern is that the Al would not be deposited conformally enough to reach the membrane on the other side of the wafer. On the other hand, a wide vertical feed-through could weaken the structural integrity of the wafer and result in excessively large (and thus weak) sealing membranes. Therefore, the pyramidal morphology of the feed-through allows the conformal deposition of Al, and precise alignment, while maintaining a minimal size for the membranes.

For a Si wafer of thickness t and a hard mask square opening of side length D on the back of the wafer, one can compute the side length of the resulting membrane d using (1).

$$d = D - \frac{2t}{\tan(54.74°)} \quad (1)$$

Hence for a 675 µm thick wafer with a square hard mask opening of 1 mm on the back of the wafer, the resulting square membrane has a side length of about 50 µm, which is small enough for the purposes of this process. One must realize that slight variations in the thickness of the wafer have a significant impact on the size of the membranes after anisotropic etching, but wafer thickness control is a common practice in semiconductor processing, and can be similarly applied in any embodiments of this invention.

When etching with TMAH, the preferred masking material is thermal SiO$_2$ since its vertical etch rate is 4 orders of magnitude lower than <100> Si. The etch rate of Si in TMAH varies typically from 20 µm/min to 25 µm/min depending on the freshness of the solution, while the etch rate of thermal SiO$_2$ is about 1 nm/min. Even a thin 100 nm thick SiO$_2$ mask therefore is normally sufficient for etching through a 675 µm thick Si wafer; therefore the 2.5 µm thick oxide layer on the back of the wafer is more than ample. Such a thick SiO$_2$ layer is used mainly for the solidity of the membranes on the front of the wafer. With thermal oxide growth, SiO$_2$ is equally grown on the back and on the front of the Si wafer.

As the stress of SiO$_2$ is highly compressive, "membranes tend to wrinkle, bow, and distort when the silicon is etched away, and are much more likely to break." (see K. Petersen, "Si as a Mechanical Material", Proc. IEEE, Vol. 70, No. 5, 1982 pp. 420-457). Even though the SiO$_2$ will eventually be etched away, the membranes must still be made thick enough to preserve their structural integrity until they are reinforced by Al and SiC. To further minimize the risk of the SiO$_2$ membranes breaking, the wafers should be handled with care, which can include positioning them vertically in all liquids involved in the processing (e.g. TMAH) in order to minimize the applied pressure on the membrane when inserting the wafer in the solution and when removing it.

Once the feed-throughs have been etched, Al interconnects and pads are created on the front of the active wafer. The locations of these pads matching that of the feed-through openings so that an aluminum layer is added to the membranes. This metal layer being deposited subsequently to the bulk etching of the feed-throughs because TMAH attacks Al at a significant etch rate. A thickness of 2 µm of SiC is then added below or above the pad for strengthening, due to the mechanical strength of SiC, and then the SiO$_2$ layer can be removed. Experiments have shown that the combination of Al and SiC can result, with appropriate process control and parameter setting, in a much smoother surface than $SiO_2$ since the compressive effect has been cancelled by its removal.

The strength of the membrane is particularly important once the cavities are vacuum sealed, because the pressure difference between the two regions separated by the membrane is considerable. In order to preserve a suitable hermetically-sealed vacuum environment for the MEMS devices, the membrane must neither rupture nor collapse, nor suffer microcracks resulting in very low leak rates such that the vacuum environment degrades over a period of days, months or years. Beneficially, the low temperature ceramic processes for the MEMS allow the feed-throughs to be filled with ceramic. Such as silicon carbide, or a combination of ceramic and soldering metal so as to make the chips less prone to breaking in case of mechanical shock.

Wafer Bonding:

When two very smooth and very clean silicon wafers are brought into contact, they have the property of forming a mutual bond. This phenomenon arising due to Van der Waals bond formation. The created bond is not very strong at room temperature, but can be reinforced by annealing, i.e. progressively heating the wafers to the highest allowable temperature for the longest possible time. However, direct bonding of silicon wafers to borosilicate glass resulted in bonds that were not strong enough at low temperatures, were degraded through non-smooth surfaces, and could not be implemented without using cleaning techniques.

Typically for direct bonding the surface of the wafers to be bonded must be flat and smooth with their roughness less than 4 nm. One must keep in mind that any standard silicon wafer in ambient air has a thin $SiO_2$ layer at the surface. Before bonding the wafers, they are soaked into a solution of hydrogen peroxide ($H_2O_2$) and ammonium hydroxide ($NH_4OH$) which creates a layer of silanol (Si—OH) bonds over the $SiO_2$ layer Annealing will make most $O_2$ and $H_2$ evaporate as $H_2O$, leaving only strong Si—O—Si bonds between the two wafers. With $O_2$ plasma surface activation, lower annealing temperatures can be used to obtain the same effect. The resulting bond strength can be as high as 20 MPa.

Silicon direct bonding was first tested on bare silicon wafers to determine the appropriate parameters of the recipe. With pressure below 1 mTorr, piston force of 1000 N and annealing at 300° C. for 20 hours, the two wafers are fully bonded with satisfactory bond strength. With the razor-blade method, also called crack-opening method and blister-test, several bonding energies for different bonding configurations have been calculated. Voids and defects at the interface of the bonding can also be detected with an IR camera. The following equation gives the surface energy (2);

$$\gamma = \frac{3Ed^3y^2}{32L^4} \quad (2)$$

where E is the Young's modulus, d is the wafer thickness, y is the blade thickness, and L is the measured crack length in mm Since the surface energy is dependent upon the fourth power of the crack length, any small crack length uncertainties results in large energy uncertainties. Therefore, many length measurements must be performed for each bonding and the resulted calculated number is just use as a coarse indicator of the bond strength. As a result instead of doing direct Si/Si bonding an approach of anodic Si/boro-silicate glass was investigated, which fortunately resulted in a process that was not more complicated than performing Si/Si bonding but instead simplified the whole WLP process by allowing a reduction in the number of steps in the process.

Anodic bonding via a silicon/borosilicate glass approach cannot use RCA-1 (named after RCA laboratories and comprising $H_2O_2$—$NH_4OH$—$H_2O$), RCA-2 ($H_2O_2$—HCl—$H_2O$) or hydrofluoric acid (HF) dip, which is not critical since anodic bonding is less demanding in terms of smoothness and cleaning. This anodic bonding process requires the removal of oxide from the front of the wafer where in contact with the cover wafer to allow bonding, since anodic bonding cannot bond with thick $SiO_2$, where additionally the silicon oxide may have been roughened by the TMAH. Dry etching of the $SiO_2$ is performed to remove it, while wet etching is employed on the wafer edges as the RIE of $SiO_2$ leaves clamp marks which are undesirable topographically for bond integrity.

Vacuum Micro-Cavity:

This step resulting in the formation of a vacuum within the package cavity comprises the steps of preparing the substrate and cover wafers, bringing the two wafers together under vacuum, and bonding resulting in a pressure differential between the inside and outside surfaces of the membranes. Membranes without reinforcement will buckle/distort allowing the level of vacuum encapsulated to be evaluated. Membranes reinforced with low temperature ceramic will not buckle in the same manner due to the pressure different as the ceramic is a hard material.

If there is a difference in atmospheric pressures inside and outside the cavities as expected, the silicon oxide membrane will bend inwards, causing a deflection D (3);

$$D = \frac{kL^4}{T^3}\Delta P \quad (3)$$

where k is material constant, L is membrane side length, T is the membrane thickness and $\Delta P$ is the pressure difference inside to outside the cavity.

This aforementioned test can be performed to verify the presence of vacuum in the cavities, but not to determine a precise level of vacuum because there are many nonlinearities in the exact equation, and intrinsic stresses may affect this phenomenon as well. The best method to accurately determine the level of vacuum is to encapsulate a resonator and measure its Q-factor. Experimentally leak rates on sealed cavities have been measured at below $1\times10^{-11}$ Pa*$m^3$/sec.

Out-Gassing:

Outgassing is a phenomenon wherein a solid substance releases vapor or gas. The materials used in chip-level bonding can generate outgassing when heated and this compromises the vacuum condition wherein pressure increases because of the created gas, for example outgassing in silicon can occur because of humidity at the point of sealing. There are several processes which can improve the vacuum conditions in the cavities:

heating the wafer before encapsulation to force evaporation of humidity in materials and organic contaminants from semiconductor processing sequence from surfaces (desorption);

integrating getters in the cavities: a getter is a solid substance which oxidizes in the presence of gas. The inclusion of getters converts outgassed gas into solid form, thereby limiting their effect on the vacuum.

With the adoption of low temperature ceramic processing for integration of MEMS with CMOS electronics the first approach has reduced maximum temperatures which can limit the removal process of water and organics. In circumstances where such outgassing is particularly detrimental to the performance of the MEMS device then the inclusion of a getter into the cavity prior to assembly with the silicon wafer may be beneficial.

Figure 5:
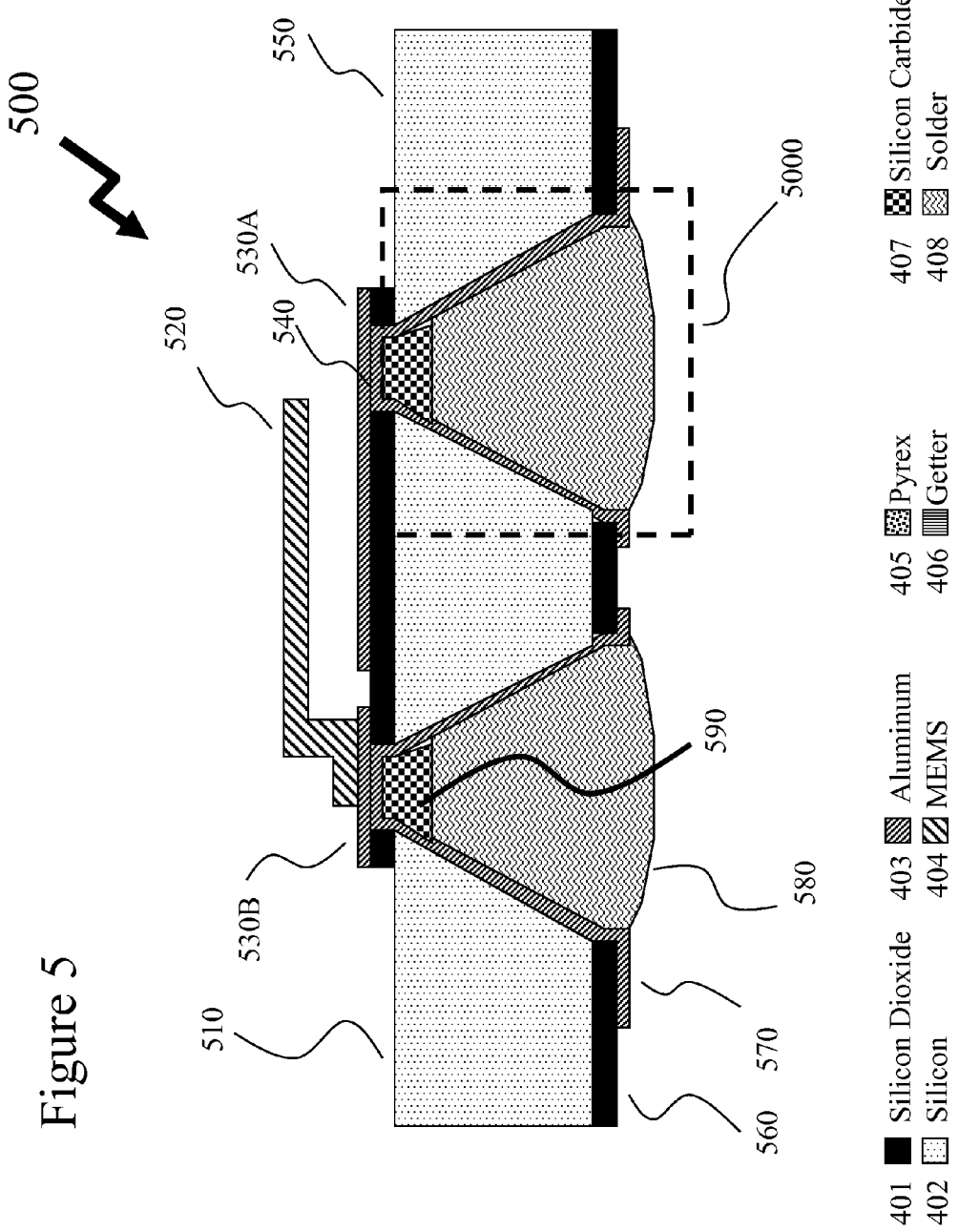
FIG. 5 depicts an exemplary embodiment of the invention as applied to the provisioning of SiC mechanical structures within through-wafer electrical feed-throughs of a silicon wafer with an integrated SiC MEMS device.

Referring to FIG. 5 there is depicted a first exemplary embodiment of the invention as applied to the provisioning of SiC mechanical structure 500 with ceramic reinforced wafer electrical feed-throughs forming part of a silicon wafer 510 with an integrated SiC MEMS device. Accordingly as shown a silicon wafer 510 has through-wafer via interconnects 5000 which have been metalized to form interconnect vias 570 after etching with the deposition of aluminum 403. The through-wafer via interconnects 5000 being aligned with openings 540 within the silicon dioxide 401 on the front surface of the wafer. The through-wafer via interconnects 5000 interconnect to first level metallizations 530A and 530B on the upper surface of the silicon wafer 510.

Formed upon the first level metallization 530B there is a MEMS structure 520 formed from low temperature ceramic MEMS material 404, such as silicon carbide 407. Within each through-wafer via interconnect 5000 there is deposited a reinforcing barrier 590 from a low temperature ceramic, such as silicon carbide 407. This reinforcing barrier 590 provides increased mechanical integrity to the through-wafer via interconnect 5000 where the structure above is a few thin layers of metal, such as aluminum 403. This is particularly beneficial wherein the upper surface of the silicon wafer 510 may be hermetically sealed under a vacuum whereas the lower surface of the silicon wafer 510 may be at atmospheric pressure. In such instances the pressure differential may cause stress in the aluminum 403 resulting in micro-cracks and other defects that may result in an abrupt failure of the hermetic seal or degraded leak rate leading to reduced performance as the vacuum is compromised.

The lower surface of the silicon wafer 510 has a patterned silicon dioxide 401 for the lower openings of the through-wafer via interconnects 5000 which has formed thereupon the aluminum 403 deposited in the initial electrical interconnection step of the through-wafer via interconnects 5000 with the conductive film 570. Finally the through-wafer via interconnects 5000 have been filled with solder 580.

Figure 6:
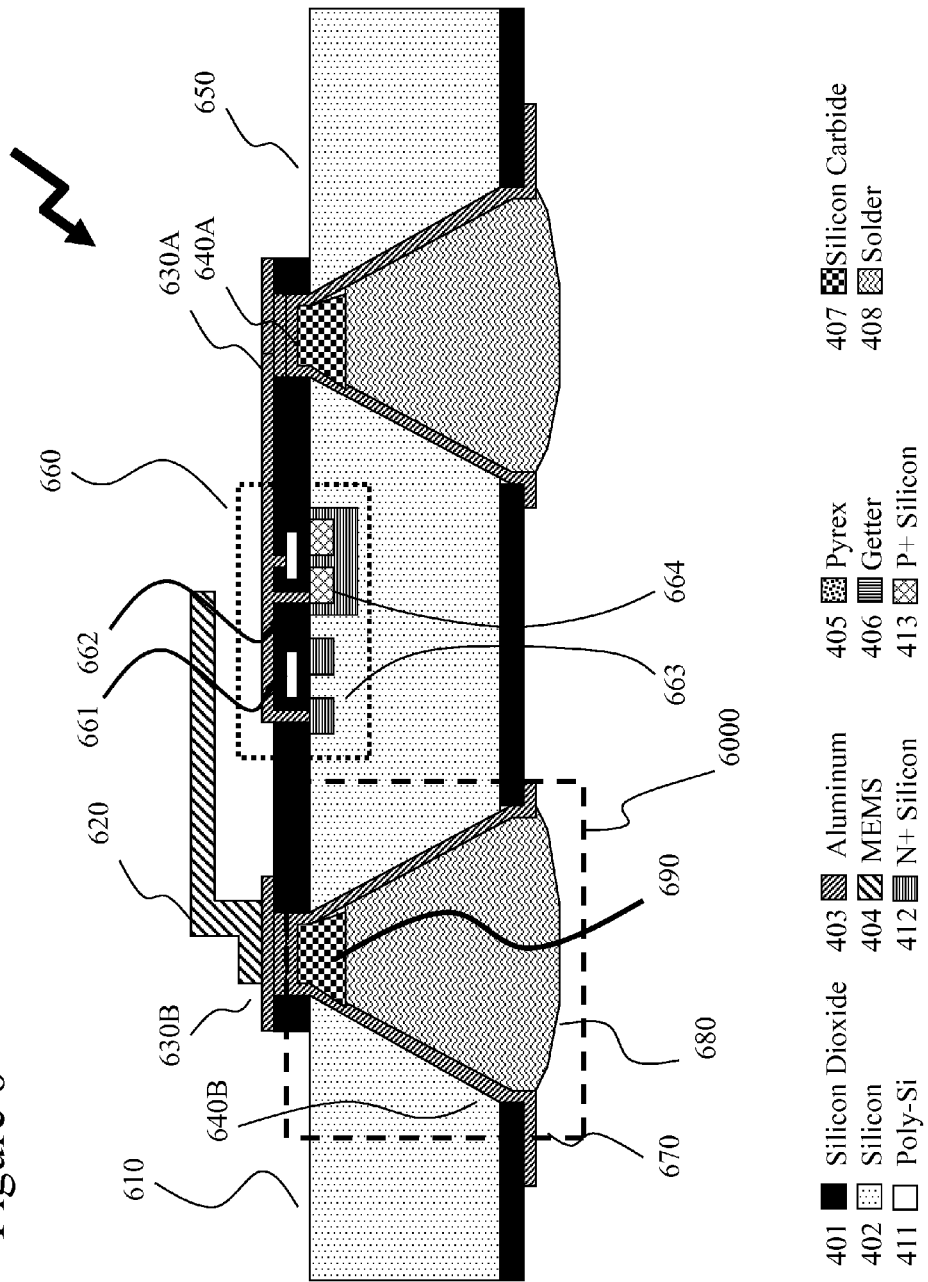
FIG. 6 depicts an exemplary embodiment of the invention as applied to the provisioning of SiC mechanical structures within through-wafer electrical feed-throughs of a silicon CMOS circuit with an integrated SiC MEMS device.

FIG. 6 depicts a second exemplary embodiment of the invention as applied to the provisioning of SiC mechanical structures within through-wafer electrical feed-throughs of a silicon CMOS circuit with an integrated SiC MEMS device;

Referring to FIG. 6 there is depicted a second exemplary embodiment of the invention as applied to the provisioning of a SiC mechanical structure 600 with ceramic reinforced wafer electrical feed-throughs forming part of a silicon wafer 610 with an integrated device comprising SiC MEMS and CMOS electronics. Accordingly as shown a silicon wafer 610 has through-wafer via interconnects 6000 which have been metalized to form interconnect vias 670 after etching with the deposition of aluminum 403. The through-wafer via interconnects 6000 being aligned with openings 640 within the silicon dioxide 401 on the front surface of the wafer. The through-wafer via interconnects 6000 interconnect to first level metallizations 630A and 630B on the upper surface of the silicon wafer 610.

Formed upon the first level metallization 630B there is a MEMS structure 620 formed from low temperature ceramic MEMS material 404, such as silicon carbide 407. Within each through-wafer via interconnect 6000 there is deposited a reinforcing barrier 690 from a low temperature ceramic, such as silicon carbide 407. This reinforcing barrier 690 provides increased mechanical integrity and hermeticity to the through-wafer via interconnect 6000 where the structure above is a few thin layers of metal, such as aluminum 403. This is particularly beneficial wherein the upper surface of the silicon wafer 610 may be hermetically sealed under a vacuum whereas the lower surface of the silicon wafer 610 may be at atmospheric pressure. In such instances the pressure differential may cause stress in the aluminum 403 resulting in micro-cracks and other defects that may result in an abrupt failure of the hermetic seal or degraded leak rate leading to reduced performance as the vacuum is compromised.

Also formed within the SiC mechanical structure 600 is CMOS circuit 660 which comprises MEMS driver circuit 663 and MEMS analysis circuit 664. As shown first level metallization 630A interconnects from one of the through-wafer via interconnects 6000 to each of the MEMS driver circuit 663 and MEMS analysis circuit 664, for example a DC power supply rail or ground interconnection. Embedded within the silicon dioxide are capacitor structures 661 and through-dielectric vias 662/

The lower surface of the silicon wafer 610 has a patterned silicon dioxide 401 for the lower openings of the through-wafer via interconnects 6000 which has formed thereupon the aluminum 403 deposited in the initial electrical interconnection step of the through-wafer via interconnects 6000 with the conductive film 670. Finally the through-wafer via interconnects 6000 have been filled with solder 680.

Figure 7:
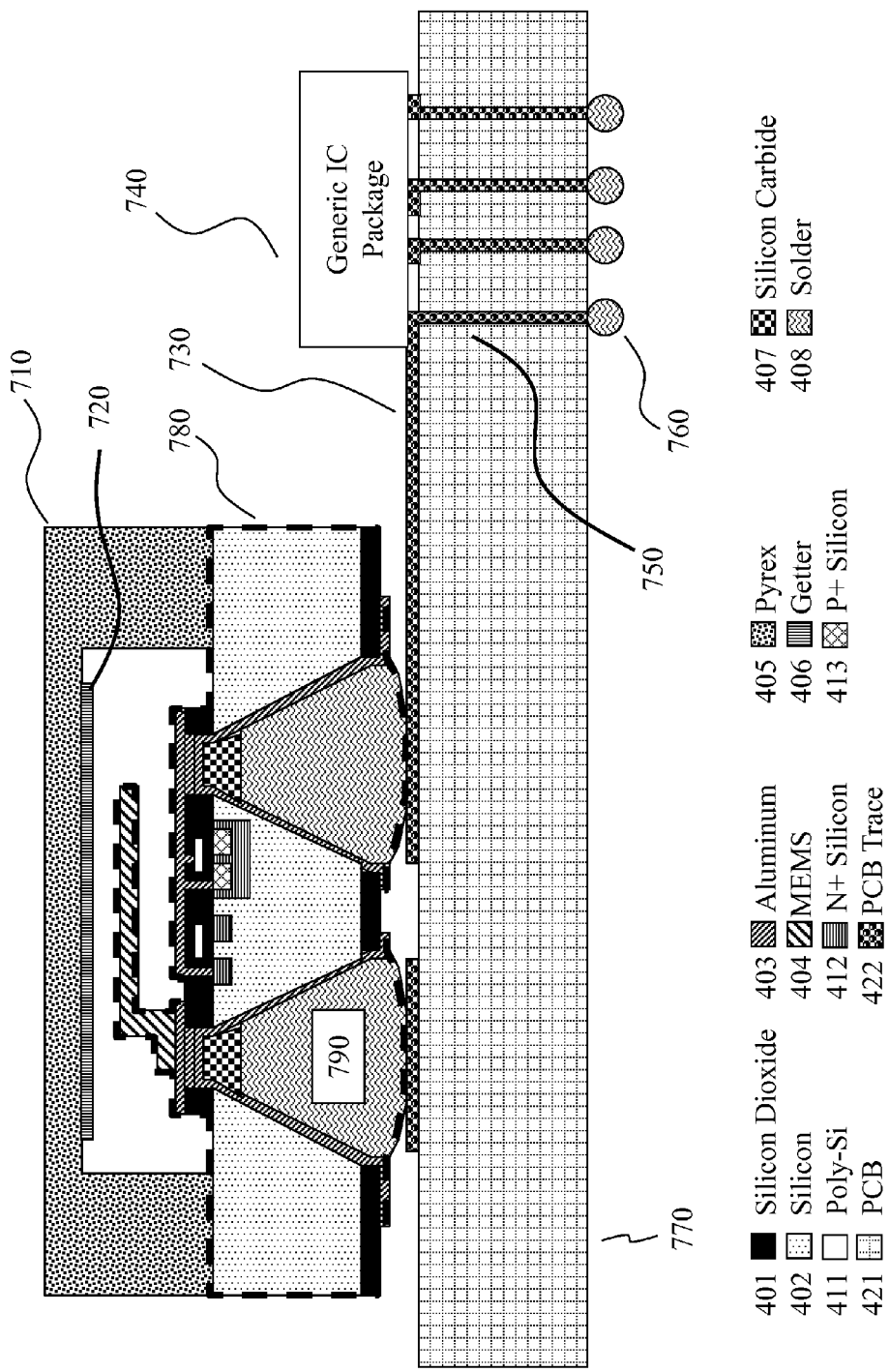
FIG. 7 depicts an exemplary embodiment of the invention as applied to the packaging of a MEMS device manufactured onto a silicon circuit with integrated CMOS electronics wherein the resultant package is surface mounted to a PCB.

FIG. 7 depicts a third exemplary embodiment of the invention as applied to the packaging of a MEMS device 780 manufactured onto a silicon circuit with integrated CMOS electronics wherein the resultant package is mounted to a PCB 770. Accordingly as shown the MEMS device 780, such as SiC mechanical structure 600 of FIG. 6 supra, has been hermetically packaged with a lid 710. Lid 710 having been manufactured with a getter material 720. The solder infill 790 of the through-wafer electrical vias, such as through-wafer via interconnect 6000 of FIG. 6, are electrically connected to PCB metallization 730. The PCB 770 supports through-PCB vias 750 which terminate in solder bump interconnect 760, and direct mounting of integrated circuits, represented by generic IC package 740. Said ancillary integrated circuits providing functions such as power supply generation, signal conditioning, signal processing, and digital communications. This embodiment reduces the interconnect parasitics with the PCB over traditional packaging solutions.

Figure 8:
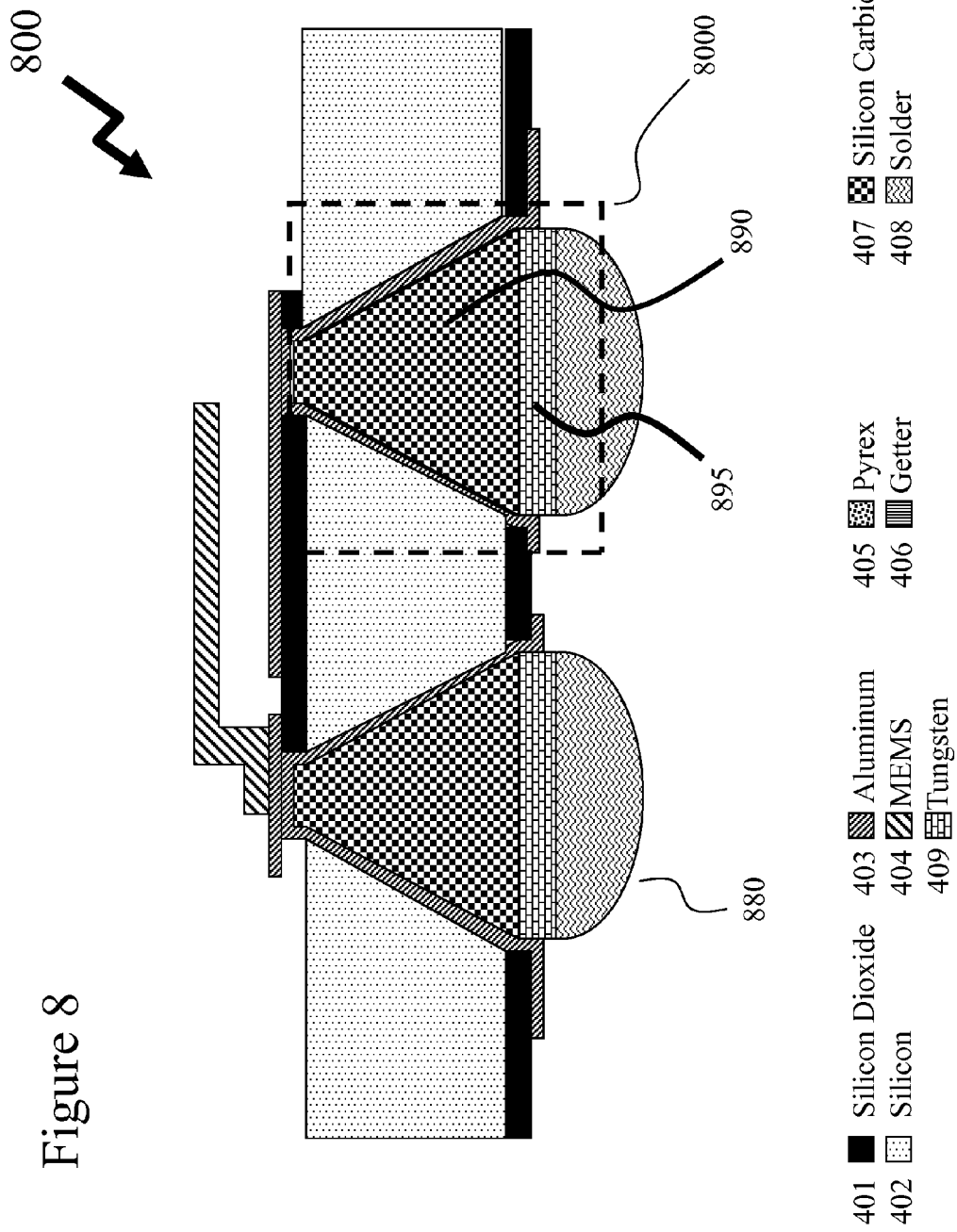
FIG. 8 depicts an exemplary embodiment of the invention wherein the electrical through-wafer connections are substantially filled with low temperature ceramic prior to provisioning of backside metallization contacts.

FIG. 8 depicts a fourth exemplary embodiment of the invention wherein a MEMS mechanical structure 800 is shown. The MEMS mechanical structure 800 being in many aspects of the design identical to SiC mechanical structure 500 of FIG. 5 except the replacement of through-wafer via interconnect 5000 with through-wafer via interconnect 8000. As depicted through-wafer via interconnect 8000 comprises a low temperature ceramic filler 890 that fills the through-wafer via with a ceramic such as silicon carbide 407, as opposed to the solder 408 of through-wafer via interconnect 5000.

In terms of properties of the MEMS mechanical structure 800 the silicon carbide 407 provides improved performance for the silicon wafer 402 when compared to solder as outlined below in Table 1. Considering firstly thermal expansion then we see that silicon carbide 407 with an expansion coefficient of $4 \times 10^{-6}$ is a much better match to silicon ($2.6 \times 10^{-6}$) than conventional eutectic tin-lead solder 408 (tin 63%/lead 37%) which has a thermal expansion coefficient of $21.4 \times 10^{-6}$, nearly 10 times higher than the silicon, or a common lead-free solder Ultrapure® SAC305 (see Kester www.kester.com) with a thermal expansion coefficient of $17 \times 10^{-6}$. Accordingly, variations of temperature for through-wafer feed-throughs such as through-wafer via interconnect 5000 employing solder would result in increased stress from the solder expansion/contraction relative to the silicon. Whilst such stress may in many instances not affect electronics such as CMOS electronics it has deleterious impact upon many MEMS structures, and could compromise membrane integrity. Accordingly, a through-wafer via interconnect 8000 filled with silicon carbide 407 would present lower stress levels for MEMS devices whilst providing a mechanically enhanced support of the MEMS structure by infilling the wafer feed-throughs.

TABLE 1

Mechanical Properties of Silicon and Silicon Carbide

| Parameter | Silicon [1] | Silicon Carbide | Solder (63% Sn/37% Pb) | Solder (96.5% Sn/3% Ag/ 0.5% Cu) | Units |
| --- | --- | --- | --- | --- | --- |
| Coefficient of Thermal Expansion | $2.6 \times 10^{-6}$ | 4.0 [2] | 21.4 [5] | ~17 [6] | |
| Thermal Conductivity | 1.412 | 120.8 [3] | 40.9 [5] | ~55 [6] | W/cm-K |
| Youngs Modulus | 155.8 | 100-150 [4] 250-400 [7] | 31.5 [5] | ~47 [6] | GPa |

[1] http://inmmc.org/ftp/material/silicon-mechanical.html
[2] http://www.accuratus.com/silicar.html
[3] CRC Materials Science and Engineering Handbook, p.278
[4] Thin Solid Films 290-291(1996), p.309
[5] http://www.efunda.com/materials/solders/tin_lead.cfm
[6] http://www.metallurgy.nist.gov/solder/clech/Sn—Ag—Cu_Overview.htm
[7] Silicon carbide thin films manufactured by the inventors Additionally, the Youngs Modulus of silicon carbide 407, which varies according to deposition process, offers elasticity closer to that of silicon 402 than the solder 408. In this manner a MEMS structure atop a structure in-filled with silicon carbide 407 will behave closer to one fabricated upon silicon without vias beneath than one in-filled with solder 408.

Beneficially, silicon carbide 407 has thermal conductivity of 120 W/cm-K which is more than 100% higher than that of a leading lead free solder (Ultrapure® SAC305 comprising 96.5% Sn, 3% Ag, and 0.5% Cu) and 200% higher than that of the leading lead-tin eutectic solder (63% Sn/37% Pb). Accordingly silicon carbide 407 can provide means for enhanced thermal management of the integrated circuits comprising MEMS structures and CMOS electronics, as evident in respect of a sixth exemplary embodiment presented below in FIG. 10.

Referring to FIGS. 9A through 9D there is depicted a fifth exemplary embodiment of the invention wherein a large low temperature ceramic insert is employed within a trench etched into the rear surface of a silicon wafer with low temperature MEMS devices and then metalized for solder bump attachment. Considering initially FIG. 9A then the plan view of a MEMS circuit is shown comprising silicon die 900 upon which are fabricated a plurality of MEMS devices 9000. Each MEMS device comprising a first electrode 970, a second electrode 920, and MEMS structure 910. Each of the first electrode 970 and second electrode 920 being formed within a first metallization on the upper surface of the silicon die 900 from depositing and patterning aluminum 403. The MEMS structure 910 being manufactured from MEMS 404 which could be for example silicon carbide 407.

Figure 9:
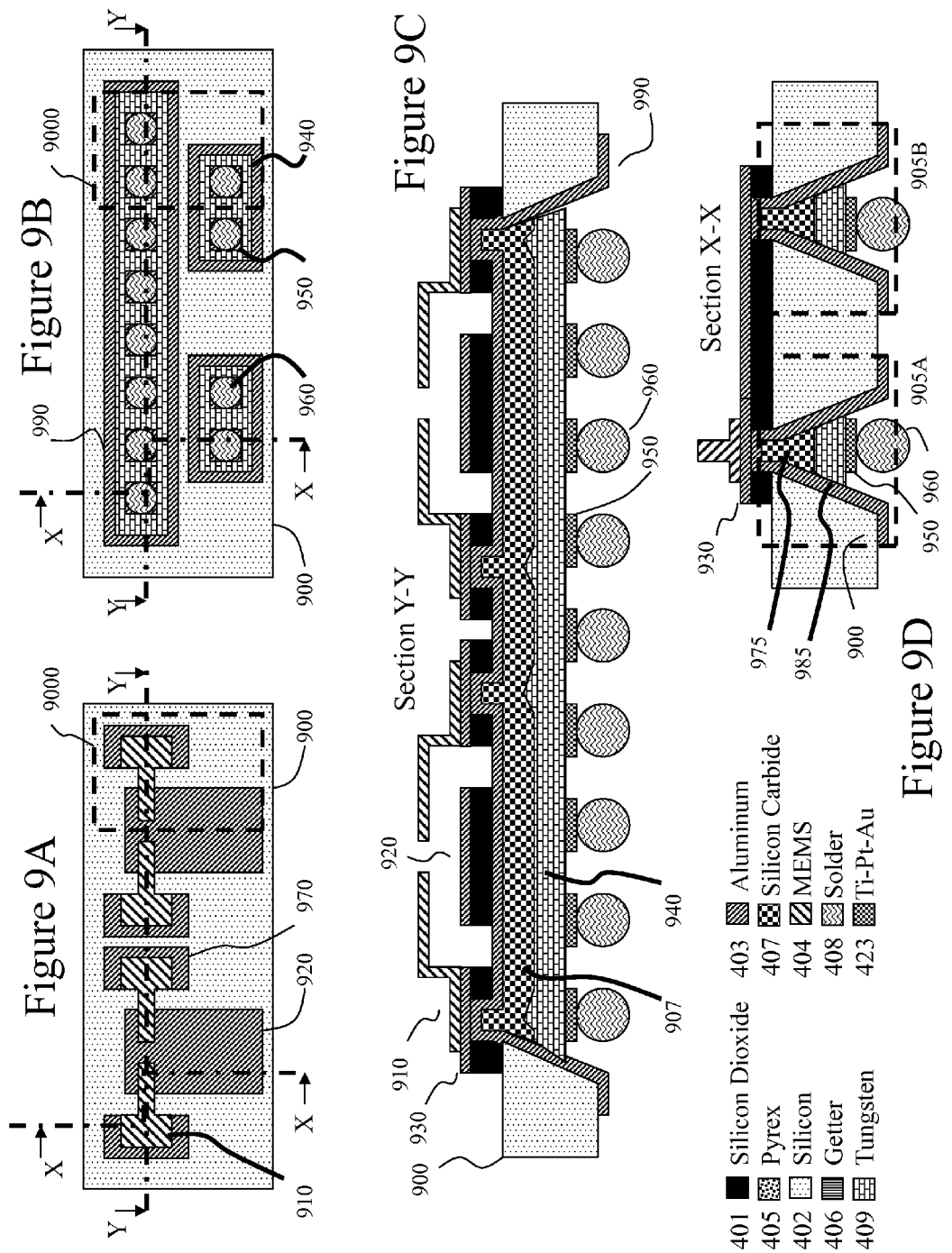
FIGS. 9A through 9D depict an exemplary embodiment of the invention wherein a large low temperature ceramic in fill is employed within a trench etched into the rear surface of a silicon wafer with low temperature MEMS devices and then metalized for solder bump attachment.

Now referring to FIG. 9B a bottom plan view of the MEMS circuit is shown. Again silicon die 900 comprises a plurality of repeating unit cells, MEMS devices 9000. As shown in the bottom plan view there is lower metallization 990, being aluminum 403, within which is plating metallization 940 of tungsten 409. Also shown are solder balls 960, formed from solder 408, which are atop ball contacts 950 of titanium-platinum-gold (Ti—Pt—Au).

This structure being more easily seen from cross-sections Y-Y in FIGS. 9C and X-X in FIG. 9D. Considering initially cross-section Y-Y in FIG. 9c there is shown a section through the plurality of MEMS devices 9000 and their through-wafer electrical contacts formed within a silicon wafer 900. Formed on the upper surface are the MEMS structures 910 of the MEMS 404 material, which are interconnected to first electrodes 970 and resonantly and capacitively coupled to second electrodes 920 formed from aluminum 403 and isolated from the silicon wafer 900 by silicon dioxide 401.

The first electrodes 970 of the plurality of MEMS devices 9000 are all interconnected by backplane 990, which is aluminum 403, as evident from bottom plan view of FIG. 9B. Thus the backplane 990 is deposited within a deep long opening etched into the silicon die 900 from the lower surface resulting in aluminum 403 being deposited in a continuous backplane 990 from the lower surface of the silicon die 900 to the upper surface and contacting each first electrode 970. Deposited into the deep long trench after the aluminum 403 deposition is ceramic support 970, in this instance silicon carbide 407. As discussed supra the silicon carbide 407 providing mechanical and thermal properties of the ceramic support 907 that are comparable to those of the removed silicon 402.

Patterned over the extent of the ceramic support 970 is spreader 940 which is patterned from tungsten 409. Positioned along the length of spreader 940 underneath the plurality of MEMS devices 9000 are solder pads 950 formed from Ti—Pt—Au 423 on which there are formed solder balls 960 of solder 408. In this manner the first electrodes 910 are all electrically coupled together and electrically accessed after final packaging through the solder balls 960 within the long trench.

Now referring to FIG. 9D there is shown the second cross-section X-X which if an offset cross-section to show that both the electrical interconnections for the first electrodes 930 and second electrodes 920 are implemented as feed-through interconnections. Accordingly FIG. 9D shows first via 905A that interconnects from the lower side of the silicon die 900 to the first electrode 930 and therefore MEMS structure 910, and second via 905B which connects to the second electrode 920. Each of the first and second vias 905A and 905B comprising silicon carbide supports 975, tungsten metallization 985, solder pad 950 and solder ball 960.

As noted supra materials within the ceramic materials 140 group outlined in FIG. 1 offering enhanced performance over silicon for MEMS. Further, as outlined in FIGS. 2A and 2B outline a low temperature fabrication sequence for silicon carbide, one member of this ceramic materials 140 group, allowing the direct integration of MEMS devices with silicon CMOS electronics. Also as discussed supra in respect of Table 1 silicon carbide also offers an increased thermal conductivity. Accordingly a ceramic structure may be integrated within a silicon circuit to provide increased thermal management within such a silicon circuit.

Figure 10:
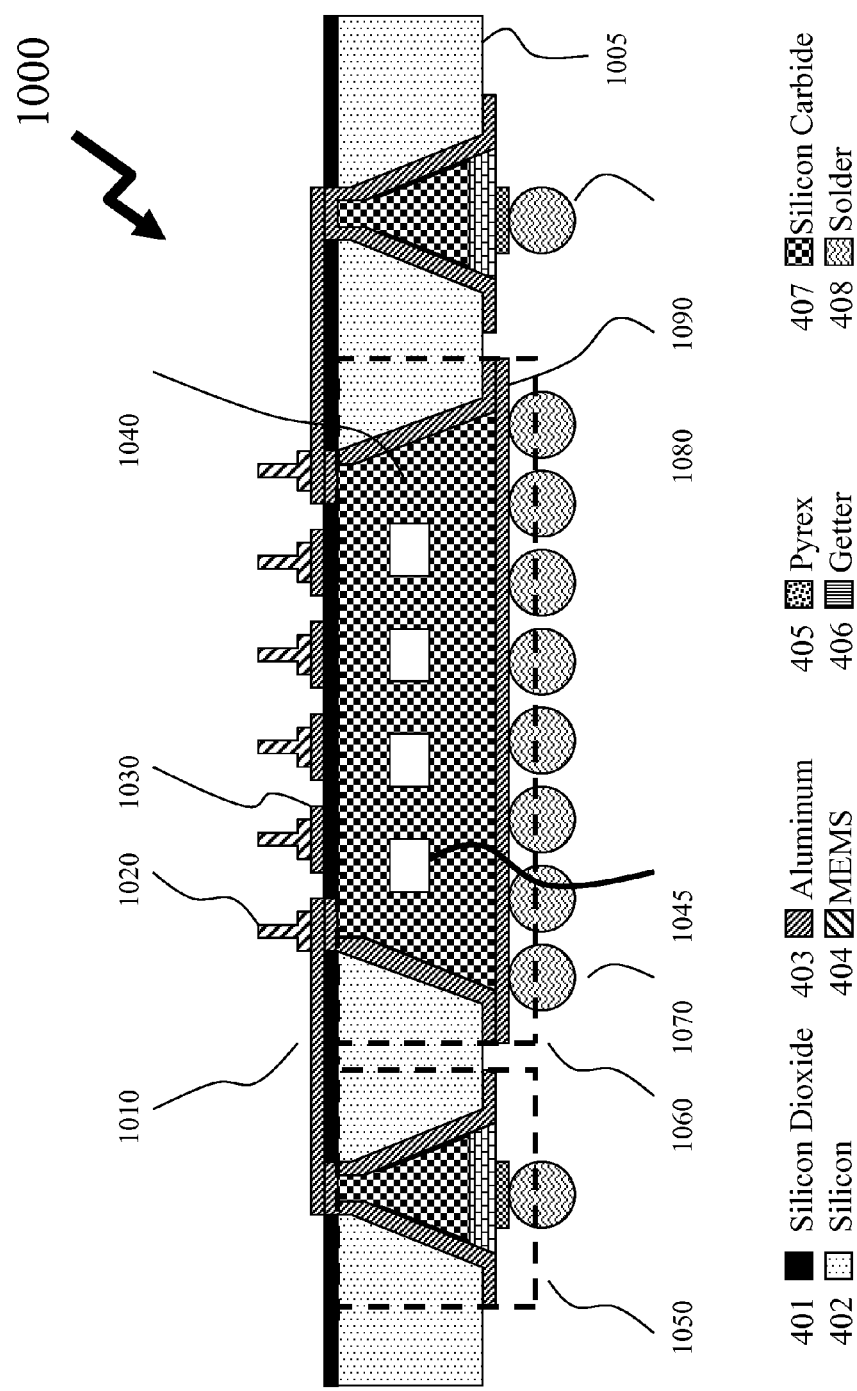
FIG. 10 depicts an exemplary embodiment of the invention wherein a low temperature ceramic insert is provided within a silicon wafer to support enhanced thermal management of a circuit integrated with the silicon wafer.

Referring to FIG. 10 a sixth exemplary embodiment of the invention is outlined in respect to ceramic thermal management structure 1000. As shown a silicon die 1005 has disposed on its surface a plurality of high power driver circuits 1020. The outermost high power driver circuits 1020 are each electrically connected to a feed-through via 1050 which has a solder ball 1090 on the lower side. The remaining high power driver circuits 1020 feed to other circuitry (not shown for clarity) via electrical traces 1030. The silicon beneath the plurality of high power driver circuits 1020 has been removed and replaced with ceramic in-fill structure 1060.

The ceramic in-fill structure comprises a ceramic plug 1040, formed for example from silicon carbide 407, which has lower metallization 1080 formed on the lower side with a plurality of solder balls 1070. Also shown within the ceramic plug 1040 are coolant channels 1045 which were formed during the deposition of the ceramic plug 1040 by a sequence of deposition, patterning, and selective material removal. The coolant channels 1045 providing a means of flowing a coolant through the ceramic plug 1040 to transfer heat away allowing the silicon die 1005 to operate either at higher thermal dissipation loads than normally supported from thermal management techniques or at higher ambient temperatures than possible from other thermal power management approaches.

Figure 11:
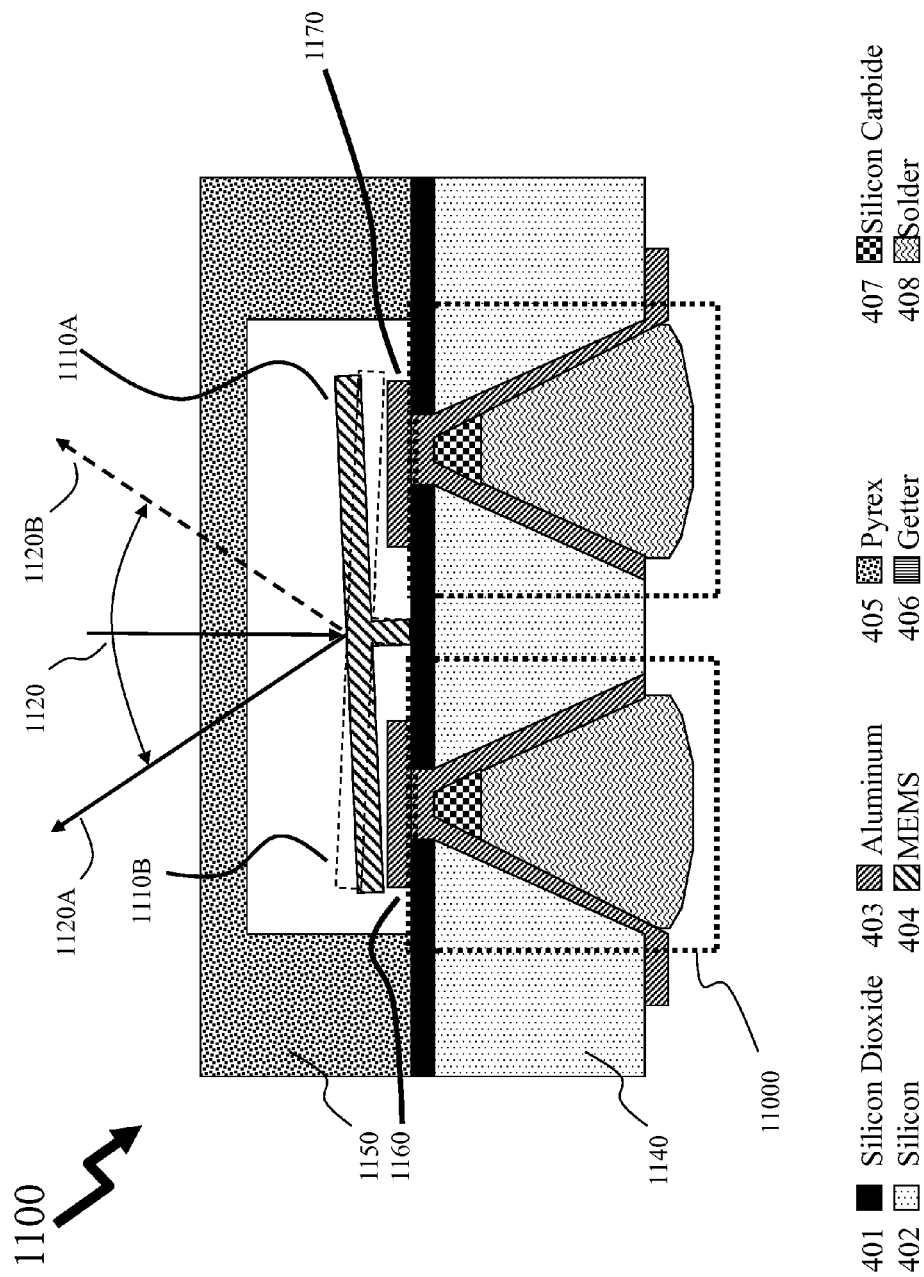
FIG. 11 depicts an exemplary embodiment of the invention wherein a low temperature ceramic insert re-inforced feed-through is employed in the packaging of a MOEM device.

Referring to FIG. 11 depicts a seventh exemplary embodiment of the invention wherein a MOEMS device 1100 employs low temperature ceramic insert feed-throughs 11000. As depicted the MOEMS device 1100 is formed atop a silicon substrate 1140 and comprises a pivoting membrane that can be pivoted from first position 1110A to second position 1110B by the appropriate application of voltage to first electrode 1160 and second electrode 1170. The pivoting membrane being attracted by electrostatic force when a voltage is applied to the first and second electrodes 1160 and 1170 respectively. Accordingly the pivoting membrane is tilted to the first position 1110A by a predetermined voltage being applied to first electrode 1160 and no voltage to the second electrode. Tilting to the second position 1110B being achieved by applying the voltage now to second electrode 1170 and none to the first electrode 1160. Each of the first and second electrodes 1160 and 1170 are electrically connected to the backside electrical interconnects of the silicon wafer via low temperature ceramic insert feed-throughs 11000 which employ silicon carbide 407 reinforcement underneath the aluminum 403 metallization on the via etched through the silicon substrate 1140.

As shown impinging onto the pivoting membrane is optical signal 1120 which passes through the optically transparent lid 1150 of the MOEMS device 1100, the optically transparent lid for example being Pyrex® within the visible spectrum (0.4 µm to 0.8 µm), aluminum oxide within the near ultraviolet (0.1 µm to 0.4 µm), and germanium for the far infrared (2 µm to 20 µm). The optical signal 1120 is reflected from the pivoting membrane such that the signal is reflected as beam 1120A when the pivoting membrane is in the first position 1110A, as one extreme, and as beam 1120B when the pivoting membrane is in the second position 1110B, the other extreme.

Now referring to FIG. 12A there is depicted a plan view 1200 of a resistive heater structure 12000 formed upon a silicon substrate 1210. The resistive heater structure 12000 being formed by a meander electrode 1240 of aluminum 403 patterned and deposited on top of a dielectric region 1250 formed from silicon dioxide 401. In operation the meander electrode 1240 provides a significant series resistance causing the dissipation of electrical power within the structure and appearing as heat. In prior art resistive heater structure 12000 the thermal conductivity of silicon results in the heat flowing away from the resistive heater structure 12000.

However, according to the methods of the instant invention it can be seen in FIG. 12B with the cross-section view 1250 of the resistive heater structure 12000 that the silicon substrate 1210 has been etched away underneath the entire resistive heater structure 12000. The dielectric region 1250 and meander electrode 1240 are supported upon a ceramic insert 1230 formed from silicon carbide 407. The meander electrode 1240 as shown being electrically connected to the backside of the silicon substrate 1210 via interconnect metallization 1220 formed of aluminum 403.

Alternatively the meander electrode 1240 may be electrically interconnected to a CMOS driver circuit integrated within the silicon substrate 1210. The enhanced thermal isolation of the deep etched region underneath the meander electrode 1240 may also be exploited in other MEMS or MOEMS devices wherein thermal tuning or stabilization are employed, such as with a MEMS resonator. The MEMS resonator rather than being formed atop a thick silicon substrate may be manufactured according to the teachings of the inventors atop a ceramic insert 1230.

Referring to FIG. 13A and FIG. 13B there is depicted an embodiment of the invention to provide a thin-film bulk acoustic wave resonator (FBAR) device 13000 by adding a piezoelectric film 432 to the structure within the process flow. This piezoelectric film can be composed of aluminum nitride (AlN), zinc oxide (ZnO) or other piezoelectric materials. These material are compatible with the thin-film technology process flows presented supra in respect of FIGS. 2A, 2B, 3 and 4 and typically do not require any modifications to the thermal budget. For instance, in the case of AlN for the piezoelectric film 432, the film deposition can be for example carried out by DC magnetron sputtering within a nitrogen ambient.

As depicted in the plan view of FIG. 13A the FBAR device 13000 is formed upon a silicon substrate 1310, with dielectric 1320 formed from silicon dioxide 401, and comprising a lower electrode 1330 formed from Aluminum 403 and an upper electrode 1340 formed from Aluminum 2 432, between which the piezoelectric film 432, which is not visible in the plan view 1300. In prior art a portion of the acoustic energy within the FBAR device 13000 itself would be radiated into an underlying substrate, silicon substrate 1310 for example, thereby incurring losses.

However, referring to cross-section 1350 in FIG. 13B the void 1370 created by the anisotropic etch of the back of the silicon substrate 1310 is instrumental in isolating the acoustic energy within the device itself, precluding it from being radiated into an underlying substrate, and thereby incurring losses. This allows for FBAR devices with a high Q-factor to be fabricated. Within FIG. 13B the piezoelectric element 1350 formed from piezoelectric film 432 can be seen between the lower electrode 1330 and upper electrode 1340. Additionally shown are the dielectric 1320 and ceramic insert 1360, formed from silicon carbide 407.

Alternatively it may be possible to remove the dielectric 1320 in instances for example where the ceramic insert 1360 is formed from a non-conducting material. Alternatively the piezoelectric element 1350 and ceramic insert 1360 may in some instances be formed from the same material. It would also be apparent to one skilled in the art that the formation of the void 1370 may be implemented in the same manufacturing steps as the vertical feed-throughs such as presented supra in respect of different embodiments as shown in FIGS. 4, 5, 6, 7, 8, 9A-9D, 10, 11, 12A-12B.

Typically FBAR devices are designed to operate at frequencies in the megahertz (MHz) to gigahertz (GHz) range, and offer Q-factors in the order of 200-2000. Thus an FBAR device 1300 according to an embodiment of the invention can be fabricated onto an integrated circuit (post-CMOS manufacturing) to alleviate the issues associated with high quality off-chip devices as reported by A. Dubois et al. "Integration of high-Q BAW resonators and filters above IC" (Digest of Technical Papers of the IEEE International Solid-State Circuits Conference, pp. 392-393, February 2005) and M. Aissi et al. "A 5.4 GHz 0.35 µm BiCMOS FBAR resonator oscillator in above-IC technology," (Digest of Technical Papers of the IEEE International Solid State Circuits Conference, pp. 1128-1235, February 2006).

The integration of FBAR devices 13000 and CMOS electronics being beneficial for example in transceivers as presented by Y. H. Chee et al. "A 46% efficient 0.8 dBm transmitter for wireless sensor networks" (Digest of Technical Papers of the Symposium on VLSI Circuits, pp. 43-44, 2006) and other applications such as discussed by A. Dubois et al, M. Aissi et al., and S. Horwitz et al. "Application of film bulk acoustic resonators" (IEEE MTT-S International Microwave Symposium Digest, pp. 165-168, June 1992). Accordingly such post-CMOS integration of active elements such as FBAR devices 13000 with reduced losses may be beneficial to the implementation of such devices to achieve improvement performance, reduced footprint and lower cost.

Figure 14A:
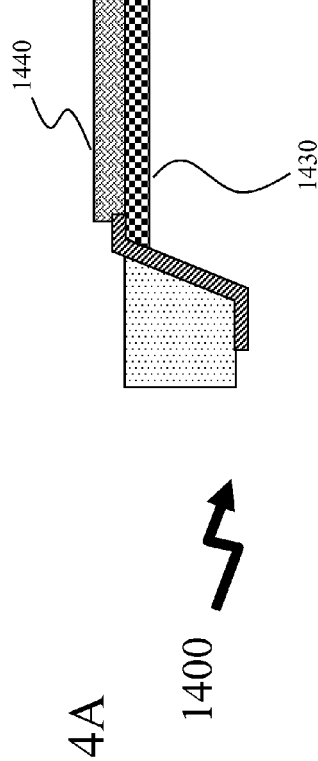
FIGS. 14A through 14C depict embodiments of the invention for the formation of pressure sensors with low temperature ceramic inserts to support membrane structures.

Referring to FIG. 14A a slightly modified version of the process can be used to fabricate a pressure sensor 1400 using piezoresistive materials. As shown the piezoresistive element 1440 formed from piezoresistive material 433, such as polysilicon, silicon, metal, etc. is deposited on the front side of a membrane 1430 formed from silicon carbide 407 which is formed within the vertical feed-through such as described supra. Fabrication of the piezoresistive material 433 is accomplished by standard micro-fabrication techniques and encapsulation can be performed in vacuum, at room temperature, or at a defined pressure. A pressure differential between the inside and outside the cavity causes the membrane to deflect therein causing stress in the piezoresistive material, and thereby modifying its resistivity. The use of silicon carbide 407 to reinforce the piezoresistive element 433 allows the sensor to sustain harsher environments and survive larger pressure differences between the interior of the cavity and the environment, therefore enhancing the range of applications for this system.

Figure 14B:
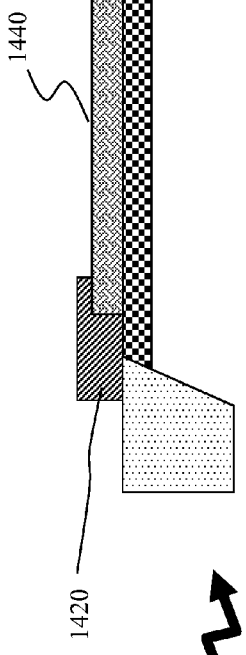
Figure 14C:
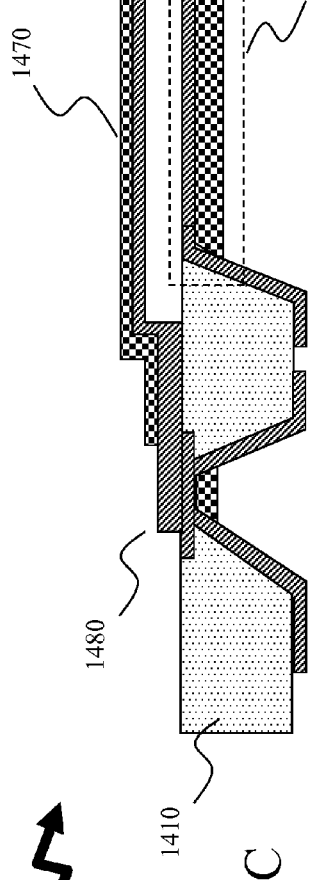

Referring to FIG. 14B there is illustrated an alternate embodiment of the pressure sensor 1410 wherein the electrical interconnection 1420 to the piezoresistive element 1440 allowing the pressure sensor to be placed at the front of the substrate in order to connect directly with monolithically integrated electronics. [00114] Alternatively, a capacitive pressure sensing method can be used as depicted in FIG. 14C to provide the pressure sensor 1420. As shown in FIG. 14C the membrane 1450 is formed from aluminum 403 and silicon carbide 407 and serves as a pressure diaphragm. Subsequently, a suspended electrode is built on top of the membrane comprising conductor 1480 formed from aluminum 403 and structural element 1470 formed from silicon carbide 407. In order to implement such a pressure sensor 1420 the processes of Nabki et al. (U.S. patent application Ser. No. 12/341,013 filed Dec. 21, 2008 "Low Temperature Ceramic Microelectromechanical Structures") wherein the space between the membrane 1450 and the suspended electrode conductor 1480 is formed by the release of a sacrificial material, e.g. polyimide.

With the deflection of the membrane 1450 arising from the pressure difference between the interior of the cavity and the environment, the capacitance between the membrane 1470 and the suspended electrode conductor 1480 will vary according to the distance between the two. The measured capacitance can therefore be related to the absolute pressure in the environment. Whilst the structure as shown indicates electrical connections for the pressure sensor 1420 being formed through feed-throughs within the silicon substrate 1410 the structure can be adapted for monolithically integrated electronics such as shown supra in respect of FIG. 14B. Alternatively to improve the sacrificial release underneath the suspended electrode, release holes can be patterned into the conductor 1480 and structural element 1470 to facilitate etchant penetration.

It would be apparent to one skilled in the art that voids or spaces within the structures presented supra being either part of the feed-throughs, vias, MEMS or other elements may be filled with an inert gas, liquid or other material according to the application and assembly requirements of the devices and structures rather than air or vacuum as generally implied within the context of the embodiments.

Numerous other embodiments may be envisaged without departing from the spirit or scope of the invention.

What is claimed is:

1. A method comprising:
providing a semiconductor substrate having first and second surfaces separated by the thickness of the semiconductor substrate, the first surface of the semiconductor substrate being one having or to have an electronic circuit fabricated within or upon;
fabricating through the substrate a via, the via comprising at least a first opening in the first surface of the substrate and a second opening in the second surface of the substrate;
filling a first predetermined portion of the via with a first electrically conductive material to provide an electrical connection from the first surface to the second surface and to provide an electrical connection to a microelectromechanical systems (MEMS) device; and
after filling the first predetermined portion of the via with the first electrically conductive material, filling a second predetermined portion of the via with an electrically non-conductive filler material with a process having a maximum exposure to the substrate during manufacturing of at least one of 250° C., 300° C., and 350° C., the second predetermined portion of the via being the full interior volume of the via from the first surface of the substrate to a first predetermined depth from the second surface of the substrate.

2. The method according to claim 1, wherein;
filling the first predetermined portion of the via with the electrically conductive material comprises depositing the electrically conductive material over a predetermined portion of the sidewalls of the via.

3. The method according to claim 1, further comprising filling a third predetermined portion of the via with a second electrically conductive material with a process having a maximum exposure to the substrate during manufacturing of at least one of 250° C., 300° C., and 350° C., the third predetermined portion being the full interior volume of the via from the surface of the first electrically non-conductive filler material at the first predetermined depth from the second surface of the substrate to a second predetermined distance from the second surface of the substrate.

4. A method according to claim 1, wherein; the electrically non-conductive filler material is selected from a group comprising silicon, silicon dioxide, silicon nitride, silicon oxynitride, carbon, aluminum oxide, and silicon carbide.

5. A method according to claim 1, wherein; filling the first predetermined portion of the via with the first electrically conductive material comprises depositing a predetermined thickness of the first electrically conductive material over a predetermined portion of the sidewalls of the via and filling the first opening to a depth approximately that of the first electrically conductive material thickness deposited.

6. The method according to claim 1, wherein filling the second predetermined portion of the via with an electrically non-conductive filler material also provides for a region of the electrically non-conductive filler being formed through the first opening to a first predetermined height above the second surface of the semiconductor substrate.

7. The method according to claim 1, further comprising; filling a third predetermined portion of the via with a second electrically conductive material; and forming upon the exposed surface of the second electrically conductive material at least one solder ball of a plurality of solder balls, wherein the third predetermined portion is the full interior volume of the via from the surface of the electrically non-conductive filler material at the first predetermined depth from the second surface of the substrate to a second predetermined distance from the second surface of the substrate; the second electrically conductive material is electrically connected to a predetermined portion of the first predetermined portion of the via with the first electrically conductive material; and both the second electrically conductive material and the solder balls are formed with processes having a maximum exposure to the substrate during manufacturing of at least one of 250° C., 300° C., and 350° C.

8. The method according to claim 1, further comprising; depositing a dielectric layer on the first surface of the substrate; forming a third opening through the dielectric layer aligned to the via before depositing the first electrically conductive material; wherein filling the first predetermined portion of the via with the first electrically conductive material therefore comprises depositing the first electrically conductive material over a predetermined portion of the sidewalls of the via and the third opening within the dielectric layer; and filling the second predetermined portion of the via with an electrically non-conductive filler material also provides for a region of the electrically non-conductive filler being formed through the third opening to a first predetermined height from the first surface of the substrate with the first electrically conductive material around the edge of the third opening.

9. The method according to claim 1, wherein filling a second predetermined portion of the via with an electrically non-conductive filler material comprises providing the electrically non-conductive filter material with at least an channel of a plurality of channels embedded within and surrounded by the electrically non-conductive filler, the plurality of channels providing fluid paths through the electrically non-conductive filler material.

10. A method comprising: providing a semiconductor substrate having first and second surfaces separated by the thickness of the semiconductor substrate, the first surface of the semiconductor substrate being one having or to have an electronic circuit fabricated within or upon; fabricating a recess through the substrate, the recess comprising at least a first opening in the first surface of the substrate and a second opening in the second surface of the substrate, wherein a portion of the recess overlaps a microelectromechanical systems (MEMS) device; and filling a predetermined portion of the recess with an electrically non-conductive filler material such that the maximum exposure to the substrate during the filling process is at least one of 250° C., 300° C., and 350° C., the predetermined portion of the recess being the full interior volume of the recess from the first surface of the substrate to a first predetermined depth from the second surface of the substrate, wherein the electrically non-conductive filler material forms a structural layer for the MEMS device; and a predetermined portion of the MEMS device has been fabricated prior to filling the predetermined portion of the recess with the electrically non-conductive filler material.

11. The method according to claim 10, wherein filling the predetermined portion of the recess with the electrically non-conductive filler material comprises depositing a first electrically conductive material over a predetermined portion of the sidewalls of the recess prior to filling the predetermined portion of the recess with the electrically non-conductive filler material.

12. The method according to claim 11, further comprising; filling a second predetermined portion of the recess with a second electrically conductive material with a process having a maximum exposure to the substrate during manufacturing of at least one of 250° C., 300° C., and 350° C., the second predetermined portion being the interior volume of the recess from the surface of the electrically non-conductive filler material at the first predetermined depth from the second surface of the substrate to a second predetermined depth from the second surface of the substrate.

13. The method according to claim 11, further comprising; depositing a dielectric layer on the first surface of the substrate; forming a third opening through the dielectric layer aligned to the recess before depositing the first electrically conductive material; wherein filing the predetermined portion of the recess with the first electrically conductive material therefore comprises depositing the first electrically conductive material over a predetermined portion of the sidewalls of the recess and the third opening within the dielectric layer; and filing the predetermined portion of the recess with an electrically non-conductive filler material also provides for a region of the electrically non-conductive filler being formed through the third opening to a first predetermined height from the first surface of the substrate with the first electrically conductive material around the edge of the third opening.

14. The method according to claim 13, further comprising;
filling a second predetermined portion of the recess with a second electrically conductive material with a process having a maximum exposure to the substrate during manufacturing of at least one of 250° C., 300° C., and 350° C., the second predetermined portion being the interior volume of the recess from a surface of the electrically non-conductive filler material at the first predetermined depth from the second surface of the substrate to a second predetermined distance from the second surface of the substrate.

15. The method according to claim 10, wherein
the electrically non-conductive filler material is selected from a group comprising silicon, silicon dioxide, silicon nitride, silicon oxynitride, carbon, aluminum oxide, and silicon carbide.

16. The method according to claim 10, further comprising;
fabricating the remainder of the MEMS device with a maximum temperature exposure to the substrate of at least one of 250° C., 300° C., and 350° C.

17. The method according to claim 10, wherein;
filling a predetermined portion of the recess with the electrically non-conductive filler material comprises providing the electrically non-conductive filter material with a plurality of channels embedded within and surrounded by the electrically non-conductive filler, the plurality of channels providing fluid paths through the electrically non-conductive filler material.

18. The method according to claim 10, further comprising;
depositing a first electrically conductive material over a predetermined portion of the sidewalls of the recess prior to filling the predetermined portion of the recess with the electrically non-conductive filler material;
filling a second predetermined portion of the recess with a second electrically conductive material after filling the predetermined portion of the recess with the electrically non-conductive filler material; and
forming upon the exposed surface of the second electrically conductive material at least one solder ball of a plurality of solder balls, wherein
the second predetermined portion is the full interior volume of the via from the surface of the electrically non-conductive filler material at the first predetermined depth from the second surface of the substrate to a second predetermined distance from the second surface of the substrate, and
both the first and second electrically conductive materials and the solder balls are formed with processes having a maximum exposure to the substrate during manufacturing of at least one of 250° C., 300° C., and 350° C.

19. The method according to claim 10, wherein
the electrically non-conductive filler forming the structural layer of the MEMS device is selected from a group comprising silicon, silicon dioxide, silicon nitride, silicon oxynitride, carbon, aluminum oxide, and silicon carbide.

20. The method according to claim 10, wherein
filling the predetermined portion of the recess with the electrically non-conductive filler material also provides for a region of the electrically non-conductive filler being formed through the first opening to a first predetermined height above the first surface of the substrate.

* * * * *